US012696419B2

(12) United States Patent
Doll

(10) Patent No.: US 12,696,419 B2
(45) Date of Patent: Jul. 28, 2026

(54) ALIGNMENT MECHANISM FOR SERVER CONNECTOR

(71) Applicant: Advanced Micro Devices, Inc., Santa Clara, CA (US)

(72) Inventor: Wade Doll, Bellevue, WA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 76 days.

(21) Appl. No.: 18/751,178

(22) Filed: Jun. 21, 2024

(65) Prior Publication Data

US 2025/0338426 A1 Oct. 30, 2025

Related U.S. Application Data

(60) Provisional application No. 63/638,276, filed on Apr. 24, 2024.

(51) Int. Cl.
*H05K 7/14* (2006.01)
(52) U.S. Cl.
CPC .................................. *H05K 7/1489* (2013.01)
(58) Field of Classification Search
None
See application file for complete search history.

(56) References Cited

U.S. PATENT DOCUMENTS

| | | | |
|---|---|---|---|
| 6,483,709 B1 | 11/2002 | Layton | |
| 9,753,504 B2 | 9/2017 | Norton | |
| 10,368,461 B2 | 7/2019 | Lindquist et al. | |
| 10,725,250 B1 * | 7/2020 | Leigh ................... | G02B 6/3885 |
| 10,840,643 B1 * | 11/2020 | Jin ....................... | H01R 12/722 |
| 11,509,079 B2 | 11/2022 | Tsai et al. | |
| 2002/0146924 A1 * | 10/2002 | Simmons ............... | H01R 24/84 |
| | | | 439/284 |
| 2023/0057471 A1 * | 2/2023 | Morgan ............... | H01R 12/737 |
| 2024/0195116 A1 * | 6/2024 | Tsang ................... | H01R 13/631 |

OTHER PUBLICATIONS

International Search Report and Written Opinion for PCT/US2025/019854 dated Jul. 2, 2025.

* cited by examiner

*Primary Examiner* — Allen L Parker
*Assistant Examiner* — Christopher L Augustin
(74) *Attorney, Agent, or Firm* — Patterson + Sheridan, LLP

(57) ABSTRACT

An alignment system is provided. In one aspect, the alignment system includes a tray configured to mount into a rack. The tray includes a first electrical connector and a first alignment element. The alignment system also includes a component configured to mount into the rack. The component includes a second electrical connector and a second alignment element. The first alignment element is configured to mate with the second alignment element when the tray is slid into the rack. Mating of the first and second alignment elements aligns the first and second electrical connectors. The first and second electrical connectors are disposed along respective axes that are parallel with a direction that the tray is slid into the rack.

14 Claims, 19 Drawing Sheets

286E

290E 214E-2

214E-1

292E

X

286E

290E 214E-2

214E-1

292E

X

D9

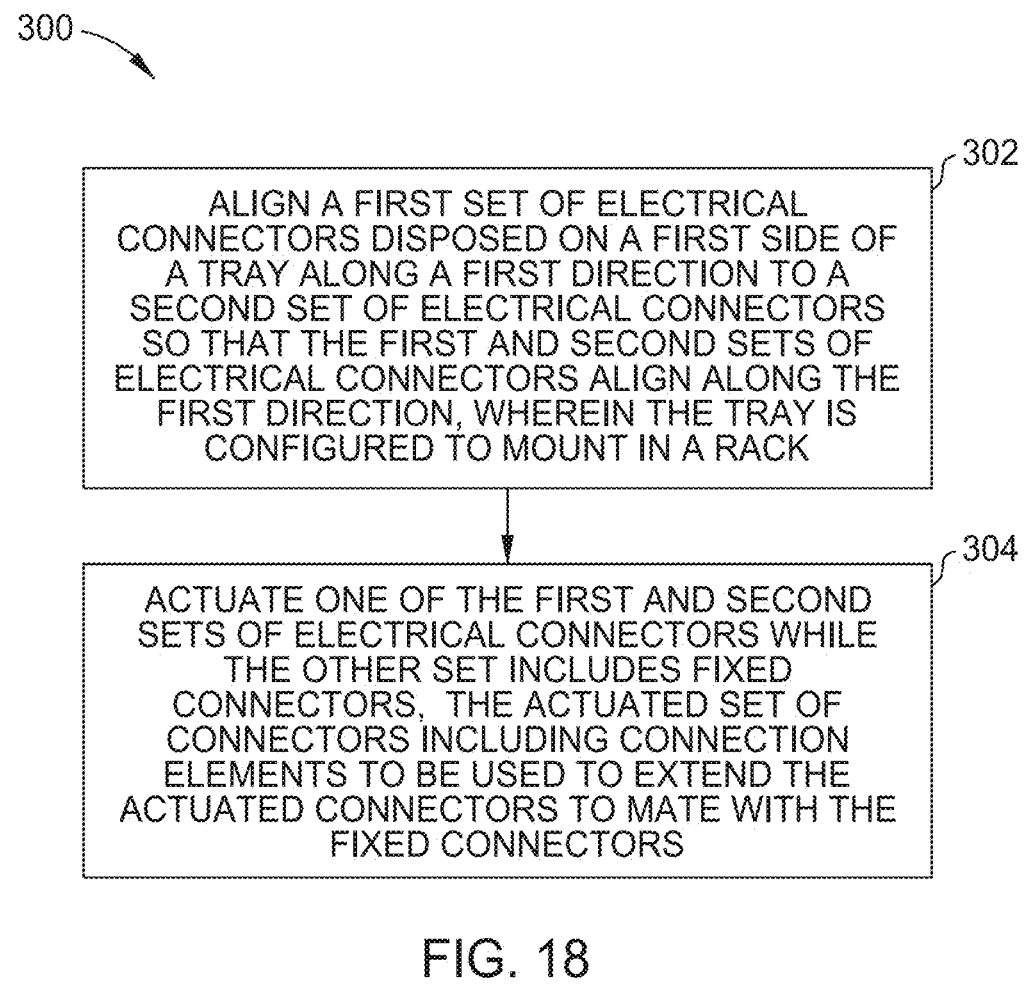

300

302

ALIGN A FIRST SET OF ELECTRICAL
CONNECTORS DISPOSED ON A FIRST SIDE OF
A TRAY ALONG A FIRST DIRECTION TO A
SECOND SET OF ELECTRICAL CONNECTORS
SO THAT THE FIRST AND SECOND SETS OF
ELECTRICAL CONNECTORS ALIGN ALONG THE
FIRST DIRECTION, WHEREIN THE TRAY IS
CONFIGURED TO MOUNT IN A RACK

304

ACTUATE ONE OF THE FIRST AND SECOND
SETS OF ELECTRICAL CONNECTORS WHILE
THE OTHER SET INCLUDES FIXED
CONNECTORS,  THE ACTUATED SET OF
CONNECTORS INCLUDING CONNECTION
ELEMENTS TO BE USED TO EXTEND THE
ACTUATED CONNECTORS TO MATE WITH THE
FIXED CONNECTORS

FIG. 18

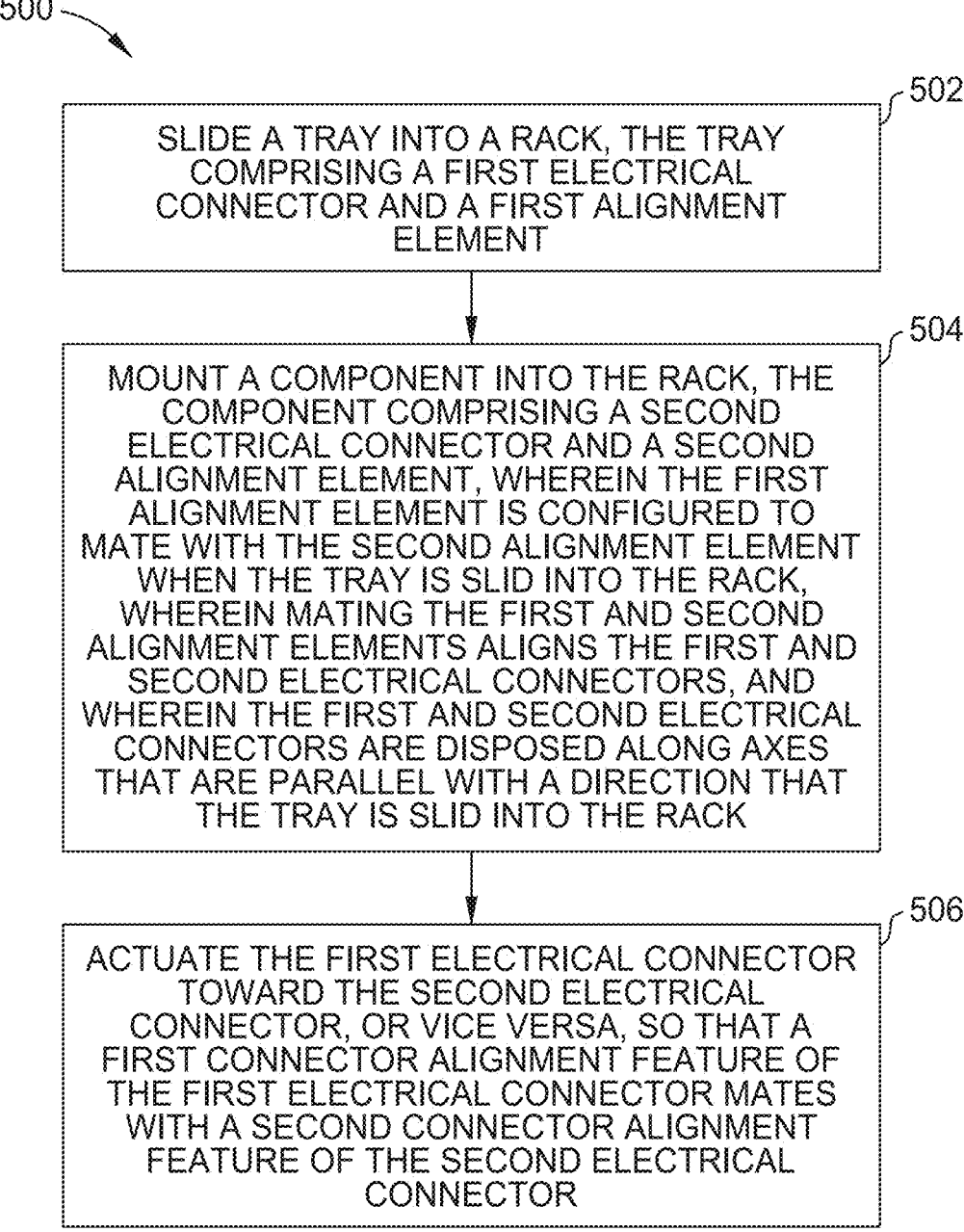

500

502
SLIDE A TRAY INTO A RACK, THE TRAY COMPRISING A FIRST ELECTRICAL CONNECTOR AND A FIRST ALIGNMENT ELEMENT

504
MOUNT A COMPONENT INTO THE RACK, THE COMPONENT COMPRISING A SECOND ELECTRICAL CONNECTOR AND A SECOND ALIGNMENT ELEMENT, WHEREIN THE FIRST ALIGNMENT ELEMENT IS CONFIGURED TO MATE WITH THE SECOND ALIGNMENT ELEMENT WHEN THE TRAY IS SLID INTO THE RACK, WHEREIN MATING THE FIRST AND SECOND ALIGNMENT ELEMENTS ALIGNS THE FIRST AND SECOND ELECTRICAL CONNECTORS, AND WHEREIN THE FIRST AND SECOND ELECTRICAL CONNECTORS ARE DISPOSED ALONG AXES THAT ARE PARALLEL WITH A DIRECTION THAT THE TRAY IS SLID INTO THE RACK

506
ACTUATE THE FIRST ELECTRICAL CONNECTOR TOWARD THE SECOND ELECTRICAL CONNECTOR, OR VICE VERSA, SO THAT A FIRST CONNECTOR ALIGNMENT FEATURE OF THE FIRST ELECTRICAL CONNECTOR MATES WITH A SECOND CONNECTOR ALIGNMENT FEATURE OF THE SECOND ELECTRICAL CONNECTOR

FIG. 20

ALIGNMENT MECHANISM FOR SERVER CONNECTOR

CROSS-REFERENCE TO RELATED APPLICATIONS

This application claims priority to the U.S. Provisional Patent Application Ser. No. 63/638,276 filed Apr. 24, 2024 of which is incorporated herein by reference in its entirety.

BACKGROUND

A rack (or cabinet) is a structure often used in data centers to hold trays of computing elements in a vertical stack. Typically, the trays are connected to each other on the rear (or back) side of the rack. That is, cables can be connected at the back sides of the trays in order to communicatively couple the compute elements in the trays to each other.

However, as the density of trays and compute elements increases in the rack, the area at the rear of the rack for routing cables has become limited, making it increasingly difficult to provide sufficient area or "beachfront" for the necessary cable connections. Compounding the problem is that the rear side of the trays is also often used for cooling the trays by including fans or vents. As the density of electrical connections increases at the rear side, this leaves less room for cooling equipment.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 18 is a flow diagram for an example method of actuating one set of connectors to mate with another set of connectors, according to an example embodiment of the present disclosure.

FIG. 20 is a flow diagram for an example method of aligning a tray with a cable cartridge and connectors of the tray with connectors of the cable cartridge, according to an example embodiment of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 2:
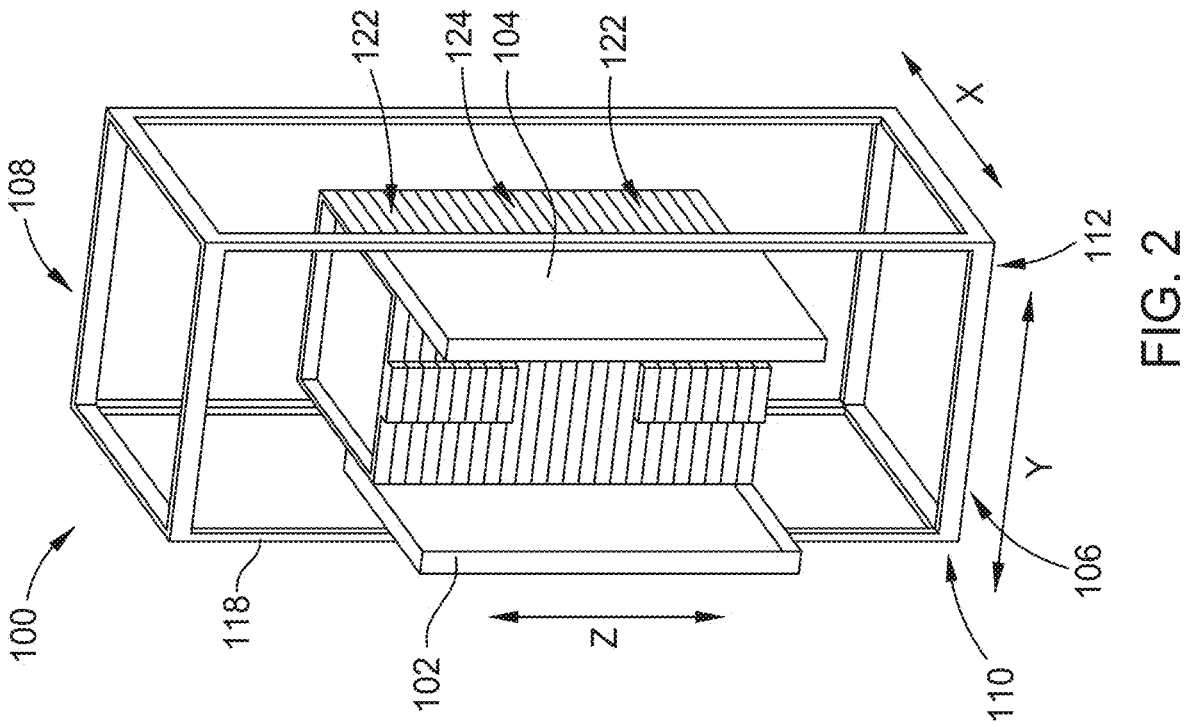
FIGS. 1, 2, and 3 illustrate various views of a rack with trays according to an example embodiment of the present disclosure.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the embodiments herein or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

A rack can hold a plurality of vertically-stacked trays with compute elements. Conventionally, such trays have been connected to each other on the rear side or back of the rack. Particularly, traditionally cables have been connected at the rear sides of the trays in order to communicatively couple the compute elements in the trays to each other and/or to switch elements. But as noted above, as the density of trays and compute elements increases in the rack, the area at the rear of the rack for routing cables has become limited, making it increasing difficult to provide sufficient area or "beachfront" for cable connections. Compounding the problem is that the rear side of the trays is also often used for cooling the trays by including fans or vents. As the density of electrical connections increases at the rear side, this leaves less room for cooling equipment and other items.

Accordingly, a rack that includes features for addressing one or more of these noted challenges is described herein. In one example aspect, a rack is disclosed. The rack can include a plurality of trays mounted in the rack in a first orientation, e.g., a horizontal orientation. The tray can include a plurality of side connectors arranged along a side of the tray. The rack can also include a cable cartridge mounted in the rack in a second orientation, e.g., a vertical orientation, which is perpendicular to the first orientation. The cable cartridge can be mounted on a side of the rack. The cable cartridge can include connectors configured to connect to side connectors arranged on sides of the plurality of trays. Further, the cable cartridge can include cables connected to the connectors in the cable cartridge to facilitate communication between the trays. For instance, each cable of the cable cartridge can connect a pair of the connectors of the cable cartridge, which provides communication between a pair of trays.

The rack of the present disclosure can provide one or more advantages, benefits, and/or technical effects. For instance, utilizing the side-cabling technique enabled by the cable cartridge and the side connectors of the trays can, among other benefits, shorten the cables of the rack relative to conventional designs, which permits the trays to be interconnected using passive differential pair cables, instead of active (powered) wire cables or optical cables. Further, the side-cabling technique of the rack of the present disclosure can allow the rear side of the rack (or provide additional "beachfront") to be used for other uses, such as for airflow (e.g., fans or vents), manifolds, power connectors, and/or other elements. In addition, the side-cabling technique disclosed herein can enable scaling of the compute elements by utilizing one or more cable cartridges and their cables to couple one stack of trays with another stack of trays within the rack, and in some embodiments, without or with a reduced need for longer cables. Such cable cartridges can also be used to scale the compute elements of the rack by facilitating coupling of the compute elements with compute elements of another rack arranged in a side-by-side arrangement with the rack. Moreover, in some aspects, the cable cartridge can be slidable, or rather, slidably mounted in the rack. This allows for the cable cartridge to be slid out and accessed at the front of the rack, e.g., for service, adding new cables, etc.

In another example aspect, different actuation techniques for coupling side connectors of a tray to connectors in a cable cartridge are disclosed. In some embodiments, one set of connectors can be moved or actuated while the other set of connectors can be fixed. The movable connectors can be on the tray while the fixed connectors can be in the cable cartridge, or vice versa. In some embodiments, both sets of connectors can be moved or actuated. In some aspects, the set of actuated connectors can be actuated individually to mate with corresponding fixed connectors, much like a zipper. This can be advantageous since less force can be applied to the actuated connectors when mating, relative to a technique that mates the connectors on at the same time (i.e., in parallel). In other aspects, the set of actuated connectors can be actuated in parallel, or rather, at the same time. This can provide efficiency in mating the connectors, among other benefits. Further, actuation of the connectors can be done manually, e.g., with a spear having a pointed tip, or automatically with an automated mechanism, e.g., a motor-driven lever that moves a bar to ultimately actuate the actuated connectors.

In a further example aspect, different alignment techniques for aligning side connectors of a tray to connectors of a cable cartridge are disclosed. For instance, a tray and a cable cartridge of a rack can each include coarse alignment features that facilitate alignment of the tray with the cable cartridge when the tray is slid into the rack, or vice versa. As one example, the tray can include one or more alignment features arranged to mate with corresponding alignment features of the cable cartridge. When the alignment features of the tray mate with their corresponding alignment features of the cable cartridge, the side connectors of the tray can be aligned with the connectors of the cable cartridge, e.g., along the sliding direction of the tray. The tray and the cable cartridge can also each include fine alignment features that facilitate secondary (or fine) alignment of the side connectors of the tray and the connectors of the cable cartridge. For instance, the side connectors of the tray can include one or more connector alignment features arranged to mate with corresponding connector alignment features of the connectors of the cable cartridge. The connector alignment features of the tray and cable cartridge can mate when the side connectors of the tray or the connectors of the cable cartridge are actuated, e.g. along a direction orthogonal to the sliding direction. Moreover, a movable bar can hold the connectors configured to actuate and can allow them to "float" or shuttle to resolve tolerances. A biasing spring can be attached to the bar to ensure that the alignment features of the tray are mated well with the alignment features of the cable cartridge, which can facilitate alignment of the connectors.

In one aspect, a system is provided. The system includes a tray configured to mount into a rack, the tray includes a first electrical connector and a first alignment element; and a component configured to mount into the rack, the component including a second electrical connector and a second alignment element, wherein the first alignment element is configured to mate with the second alignment element when the tray is slid into the rack, wherein mating the first and second alignment elements align the first and second electrical connectors. The first and second electrical connectors are disposed along respective axes that are parallel with a direction that the tray is slid into the rack.

In another aspect, a rack is provided. The rack includes a tray slidably mounted within the rack and having a first set of electrical connectors disposed on a side of the tray along a first direction, the tray being slidable along the first direction and having a first alignment element; and a cable cartridge mounted within the rack and having a second set of electrical connectors arranged along the first direction, the cable cartridge having a second alignment element. The first alignment element is arranged to mate with the second alignment element so as to align the first and second electrical connectors along the first direction. At least one of the first set of electrical connectors and the second set of electrical connectors is movable along a second direction perpendicular to the first direction.

In a further aspect, a method is provided. The method includes sliding a tray into a rack, the tray including a first electrical connector and a first alignment element; and mounting a component into the rack, the component including a second electrical connector and a second alignment element, wherein the first alignment element is configured to mate with the second alignment element when the tray is slid into the rack, wherein mating the first and second alignment elements align the first and second electrical connectors. The first and second electrical connectors are disposed along axes that are parallel with a direction that the tray is slid into the rack.

Side Cable Cartridges

Figure 1:
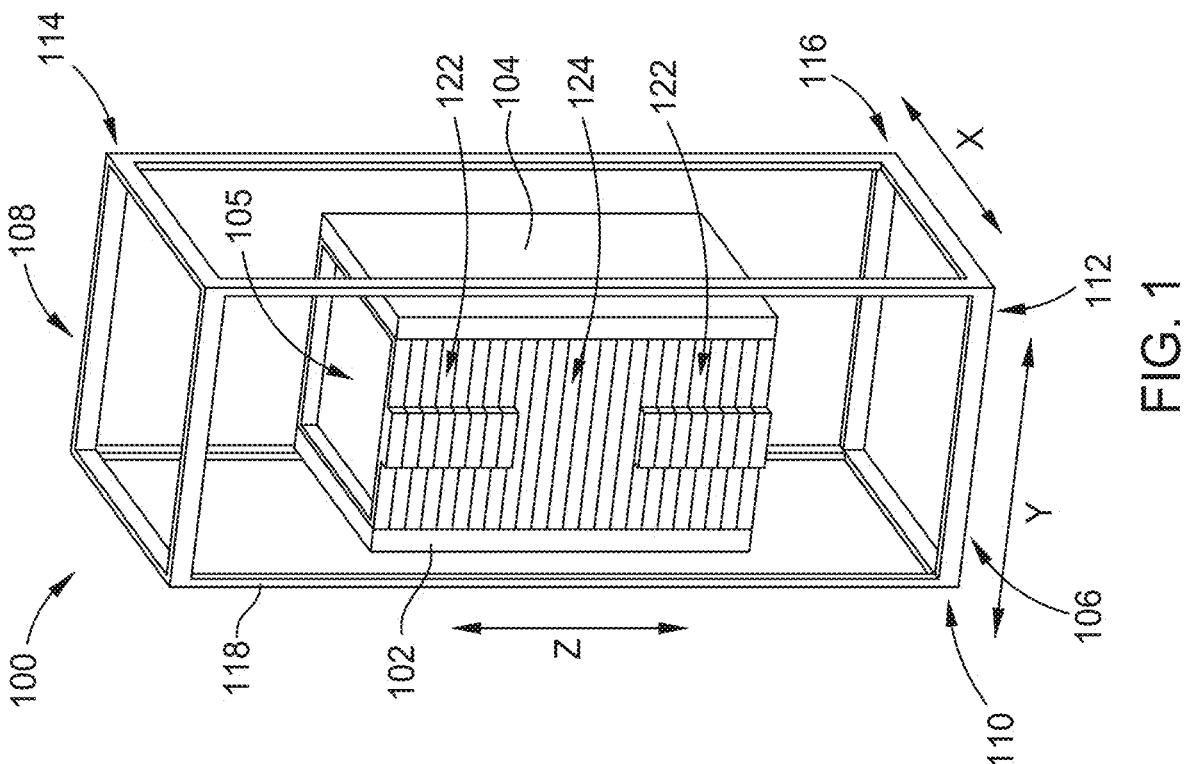
Figure 3:
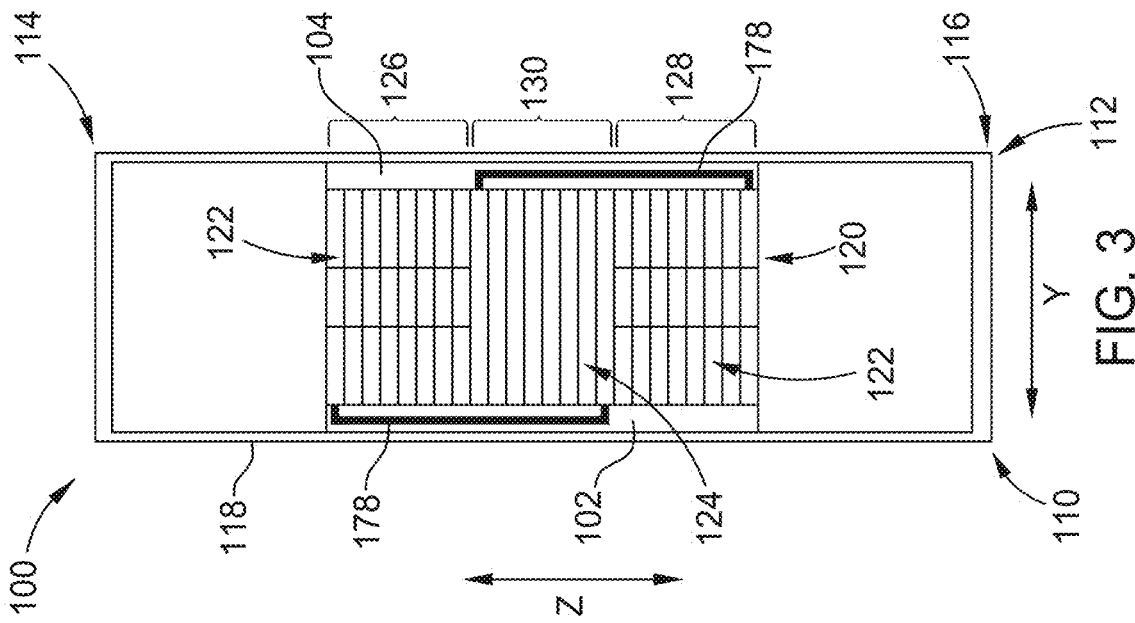

FIGS. 1, 2, and 3 illustrate various views of a rack 100 according to various embodiments of the present disclosure. FIG. 1 is a front perspective view of the rack 100 with first and second cable cartridges 102, 104 thereof arranged in respective engaged positions, FIG. 2 is a front perspective view of the rack 100 with the first and second cable cartridges 102, 104 slid out from their respective engaged positions, and FIG. 3 is a front view of the rack 100. For reference, the rack 100 defines a first direction X, a second direction Y, and a third direction Z, which are mutually perpendicular to one another and form an orthogonal direction system. The first direction X can be a transverse direction, the second direction Y can be a lateral direction, and the third direction Z can be a vertical direction, for example. The rack 100 has a front side 106, a rear side 108, a first side 110, and a second side 112. The front side 106 is spaced from the rear side 108, e.g., along the first direction X. The first side 110 is spaced from the second side 112, e.g., along the second direction Y. The rack 100 also has a top 114 and a bottom 116, which are spaced from one another along the third direction Z.

The rack 100 includes a frame 118 supporting a plurality of trays 120, with some of the trays 120 containing compute elements (i.e., compute trays 122) and some containing switch elements (i.e., switch trays 124). For example, the compute trays 122 can include one or more data processing elements, such as central processing units (CPUs), application specific integrated circuits (ASIC), field programmable gate array (FPGA), parallel processors (e.g., graphic processing units (GPUs), tensor processors, data processing units (DPUs), and the like), or some combination of the foregoing. The switch trays 124 can include one or more switch elements, such as network switch integrated circuits. The compute trays and the switch trays 124 can be collectively referred to herein as trays 120. The trays 120 are mounted in the rack 100 in a first orientation, e.g., a horizontal orientation.

In some embodiments, the compute trays 122 include the same compute components (e.g., a tray containing multiple GPUs). In other embodiments, the compute trays 122 include a mixture of compute components (e.g., a tray containing GPUs and FPGAs). For ease of explanation, the remaining discussion assumes that the compute trays 122 include multiple GPUs (e.g., a GPU tray), however, this is just one example and is not intended to be limiting.

In at least some embodiments, the compute trays 122 and the switch trays 124 can be clustered within the rack 100. For instance, for the rack of FIGS. 1, 2, and 3, the rack 100 includes a first cluster 126 of compute trays 122, a second cluster 128 of compute trays 122, and a cluster 130 of switch trays 124 sandwiched or arranged between the first and second clusters 126, 128 of compute trays 122, e.g., along the third direction Z. Accordingly, the first cluster 126 of compute trays 122 is arranged on a different side of the switch trays 124 than the second cluster 128 of compute trays 122. Arranging the cluster 130 of switch trays 124 between the first and second clusters 126, 128 can reduce a length of cables needed to connect the compute trays 122 with the switch trays 124. Each cluster of the rack 100 can include a same number of trays or the clusters can have different numbers of trays.

Figure 4:
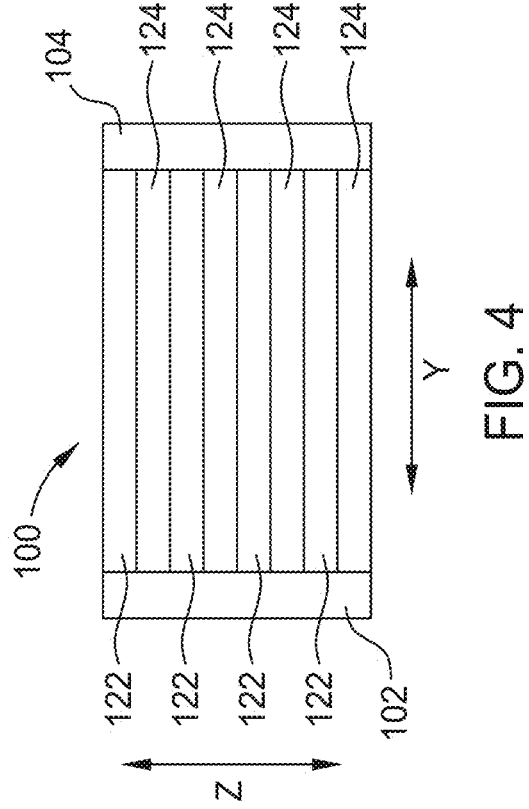
FIG. 4 illustrates a close-up view of one example arrangement of trays for a rack according to an example embodiment of the present disclosure.

FIG. 4 illustrates a rack that includes interleaved compute trays 122 and switch trays 124. In this example, instead of clustering the compute trays 122 and the switch trays 124, one type of tray is interleaved with a different type of switch tray. This may reduce latency. Thus, the embodiments herein can include any type of arrangement where different types of trays can be connected to side cable cartridges.

Figures 5, 6:
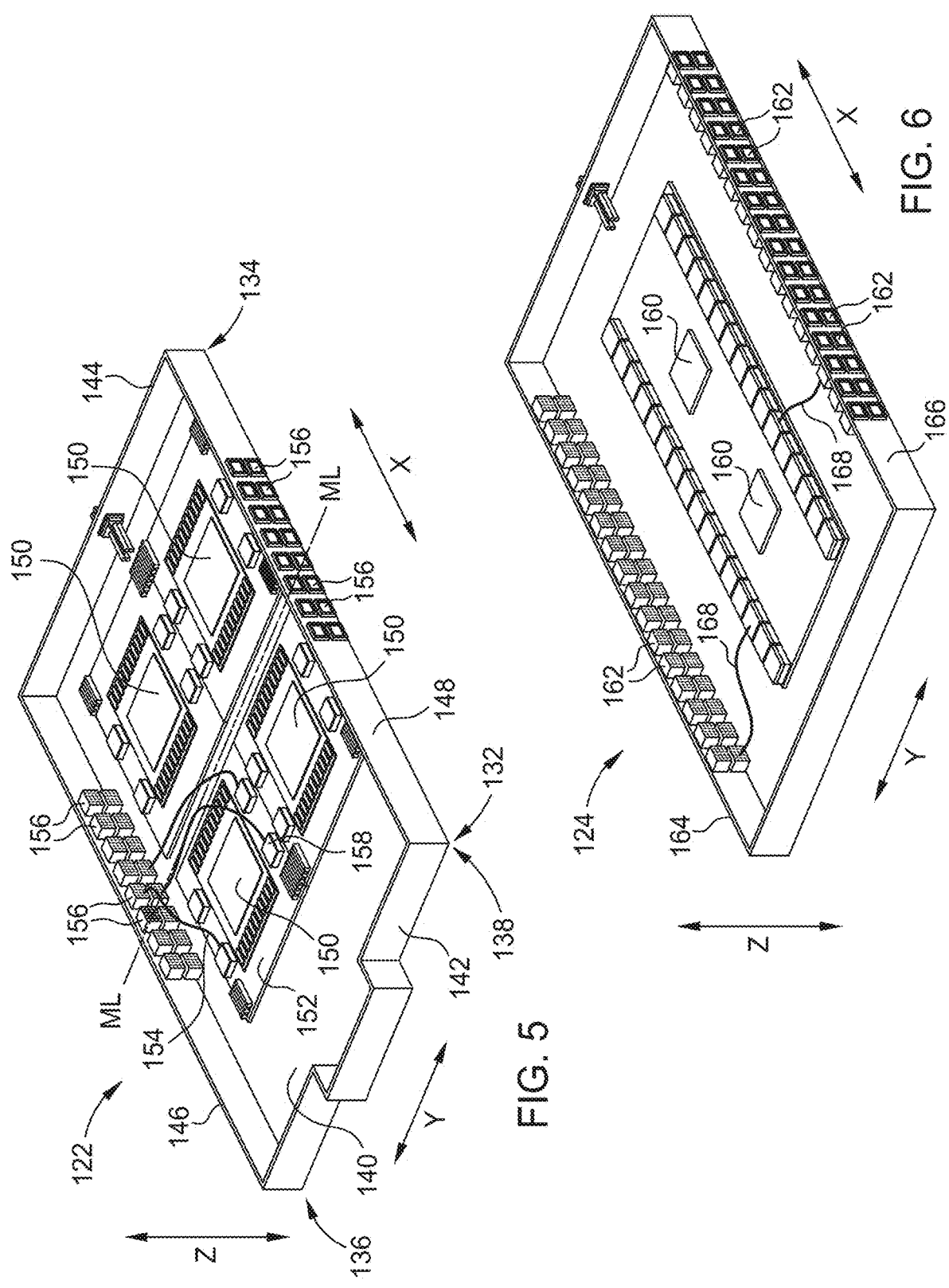
FIGS. 5 and 6 illustrate a compute tray and a switch tray, respectively, of the rack of FIGS. 1, 2, and 3.

With reference now to FIGS. 5 and 6, an example compute tray and an example switch tray will be further described. FIG. 5 illustrates one example compute tray 122. FIG. 6 illustrates one example switch tray 124. As shown in FIG. 5, the compute tray 122 has a front side 132, a rear side 134, a first side 136, and a second side 138. The compute tray 122 has a tray base 140 and a plurality of walls extending from the tray base 140, e.g., along the third direction Z. The walls include a front wall 142, a rear wall 144, a first sidewall 146, and a second sidewall 148. The tray base 140 and the walls 142, 144, 146, 148 define a tray volume in which various components are arranged, such as compute elements 150.

The compute elements 150 in the compute tray 122 can be mounted on substrates 152 (e.g., printed circuit boards (PCBs)). The compute elements 150 can be CPUs, ASICs, FPGAs, or parallel processors (e.g., GPUs, tensor processors, DPUs, and the like), for example. Flyover cables 154, which can be passive differential pair (DP) wire cables, can connect the compute elements 150 to side connectors 156. Specifically, the short flyover cables 154 can connect the side connectors 156 with board connectors 158, which are in turn connected to their respective compute elements 150. The side connectors 156 can be arranged in the first and second sidewalls 146, 148 of the compute tray 122. In some embodiments, the first and second sidewalls 146, 148 can each contain twice the number of side connectors 156 than there are switch trays 124 in the rack 100 (FIG. 1). The side connectors 156 of the first sidewall 146 and the side connectors 156 of the second sidewall 148 can be aligned with one another, e.g., along the first direction X. Further, in some embodiments, the sets of side connectors 156 of the first sidewall 146 and/or the second sidewall 148 can be centered on a midline ML defined by the compute tray 120.

In the example compute tray 122 of FIG. 5, there are no connectors on the rear wall 144 at the rear side 134 (or backside) of the compute tray 122. Accordingly, the rear side 134 can be used for airflow (e.g., fans or vents), manifolds, power connectors, and/or other elements. However, in other embodiments, the rear wall 144 can include one or more connectors that can be used to connect the compute tray 122 with another tray.

By arranging the side connectors 156 at the first and second sides 136, 138 of the compute tray 122, the length of the flyover cables 154 may be reduced relative to using connectors at the rear side 134. The flyover cables 154 may be much longer if they extend from the compute elements 150 to connectors at the rear side 134 of the compute tray 122, especially flyover cables 154 that extend from compute elements 150 arranged at a forward portion of the compute tray 122. In this manner, using the side connectors 156 can reduce the length of the internal flyover cables 154, which can enable the use of passive wire cables (instead of active wire cables or optical fibers) and/or improve signal quality relative to using passive wire cables that extend to the rear side 134 of the compute tray 122.

Similar advantages can be gained by connecting switch elements 160 (e.g., network switch integrated circuits) in the switch tray 124 to side connectors 162, which are arranged in first and second sidewalls 164, 166 of the switch tray 124 as depicted in FIG. 6. In this way, flyover cables 168 can be made shorter, using passive wire cables, improved signal quality, and/or freeing the rear side for airflow elements, manifolds, and power connectors. In some embodiments, however, the switch tray 124 can also include one or more connectors at its rear wall that can be used to connect to the switch tray 124 with the compute tray 122 or some other tray type.

Returning to FIGS. 1, 2, and 3, the first and second cable cartridges 102, 104 will be further described. As depicted the first and second cable cartridges 102, 104 are mounted in the rack 100 in a second orientation, e.g., a vertical orientation that is perpendicular to the first orientation (e.g., a horizontal orientation). Accordingly, in the example embodiment of FIGS. 1, 2, 3, the first and second cable cartridges 102, 104 are oriented in the rack 100 perpendicular to the trays 120. In some aspects, the first and second cable cartridges 102, 104 each have a longest length that extends vertically and the plurality of trays 120 each have a longest length, with each of the longest lengths of the plurality of trays 120 extending horizontally.

As shown in FIG. 3, like the trays 120, the first and second cable cartridges 102, 104 can be slid out of the front side 106 of the rack 100. That is, the first and second cable cartridges 102, 104 are slidable, e.g., along the first direction X. As such, the first and second cable cartridges 102, 104 and the trays 120 are serviceable at the front side 106. The first cable cartridge 102 is disposed on the first side 110 of the rack 100 and the second cable cartridge 104 is disposed on the second side 112 opposite the first side 110.

Figure 7:
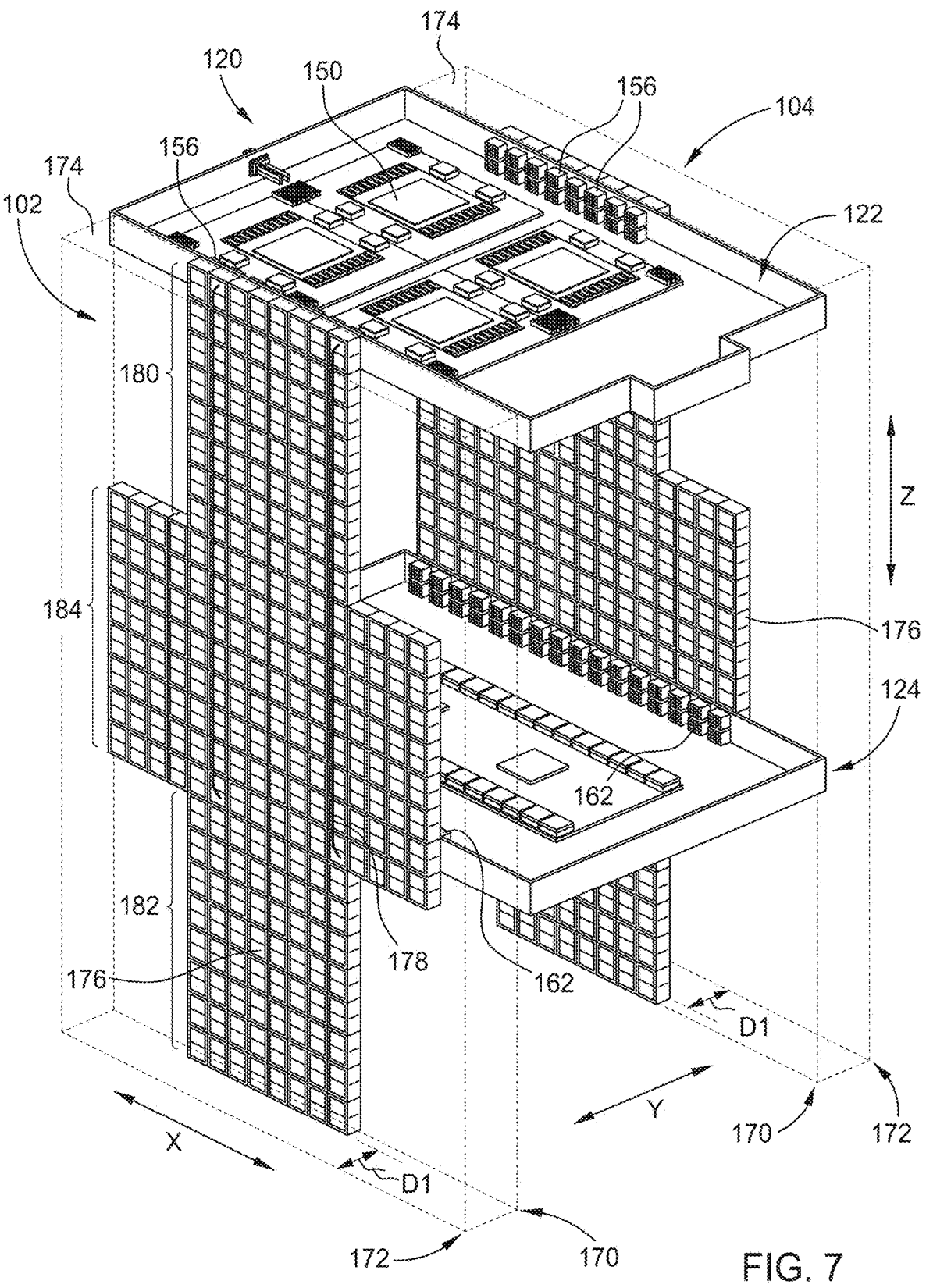
FIGS. 7 and 8 illustrate perspective views of a compute tray and a switch tray being coupled with cable cartridges of the rack of FIGS. 1, 2, and 3.
Figure 8:
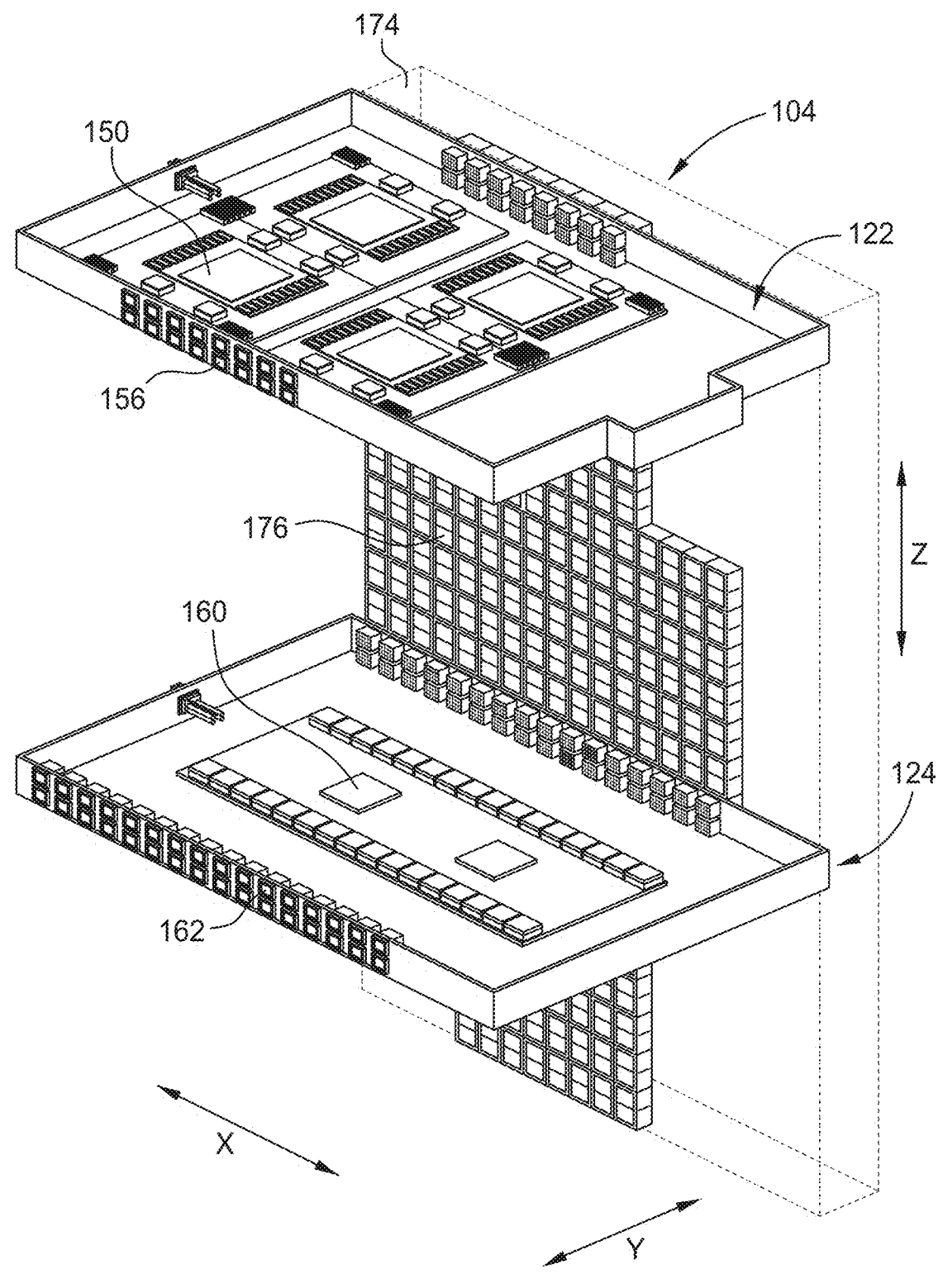

FIGS. 7 and 8 illustrate perspective views of one of the compute trays 122 and one of the switch trays 124 arranged relative to the first and second cable cartridges 102, 104. In FIG. 7, both the first and second cable cartridges 102, 104 are depicted while the first cable cartridge 102 is removed in FIG. 8 for illustrative purposes.

The first cable cartridge 102 has an inner side 170 and an outer side 172 and includes a housing 174. The inner side 170 faces inward toward the trays 120 and the outer side 172 faces away from the trays 120. The first cable cartridge 102 also includes a plurality of connectors 176 disposed within the housing 174. The connectors 176 are generally arranged within the housing 174 at the inner side 170. The connectors 176 are spaced from the outer side 172 by a distance D1 so as to provide room (e.g., an outer volume) for cables 178 (only two cables are shown in FIG. 7) to connect respective pairs of the connectors 176 of the first cable cartridge 102. For instance, each one of the cables 178 can connect a connector associated with one of the compute trays 122 with a connector associated with one of the switch trays 124. In this regard, the cables 178 can be connected to the connectors 176 to facilitate communication between the trays 120, as will be explained in detail further below.

At the inner side 170, the connectors 176 of the first cable cartridge 102 are configured to connect to respective ones of the side connectors 156, 162 on the first side of the plurality of trays 120. In at least some embodiments, the connectors 176 of a first set 180 are configured to connect to respective ones of the side connectors 176 of the compute trays 122 of the first cluster 126 (FIG. 3), the connectors 176 of a second set 182 are configured to connect to respective ones of the side connectors 156 of the second cluster 128 (FIG. 3) of the compute trays 122, and the connectors 176 of a third set 184 are configured to connect to respective ones of the side connectors 162 of the cluster 130 (FIG. 3) of the switch trays 124. The third set 184 has more columns of connectors (e.g., sixteen (16) columns) than does the first and second sets 180, 182 (e.g., eight (8) columns each), but each one of the sets 180, 182, 184 has a same number of rows, e.g., sixteen (16) rows. Accordingly, in this example embodiment, the connectors 176 form a cross pattern since the switch trays

124 include more connectors than the compute trays 122, but this is just one implementation.

The second cable cartridge 104 is configured in a same or similar manner as the first cable cartridge 102, and accordingly, the reference numerals used to denote features of the first cable cartridge 102 have been used to denote the same features of the second cable cartridge 104.

Figure 9:
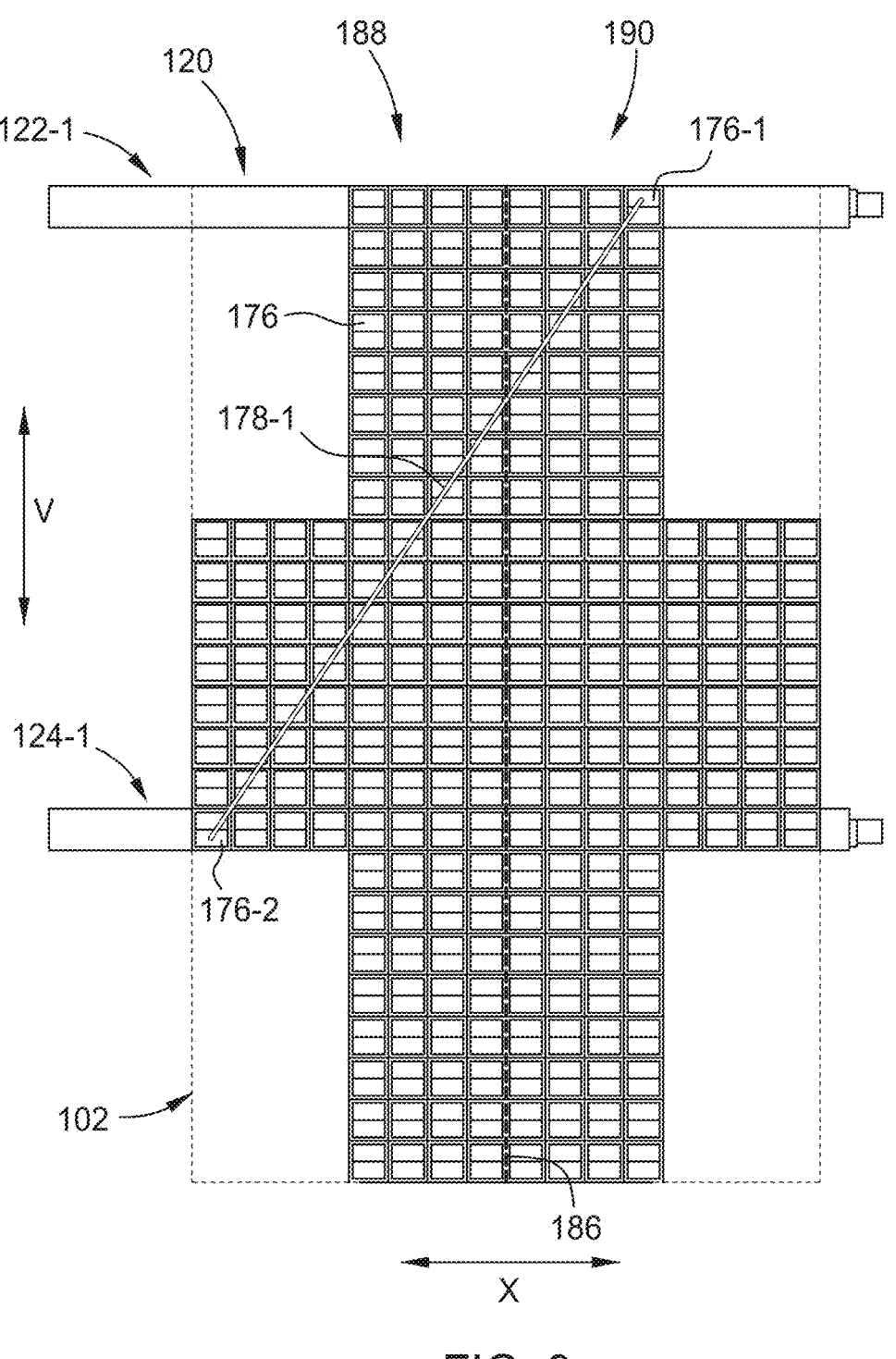
FIG. 9 illustrates a side view of a cable cartridge of the rack of FIGS. 1, 2, and 3.

FIG. 9 illustrates a side view of the first cable cartridge 102 and shows a path of a cable 178-1 that represents a longest cable length for interconnecting a connector 176-1 of a topmost compute tray 122-1 to a connector 176-2 of a bottommost switch tray 124-1. In one embodiment, the cable 178-1 may have a length of 0.9 meters to 1.2 meters and connects to a pair of connectors 176-1, 176-2 in the first cable cartridge 102. The connectors 176-1, 176-2 in turn mate with the side connectors on the sides of the trays 122-1, 124-1, respectively. But this distance can be reduced by being selective on which connectors are connected together in the cable cartridge.

In some embodiments, as shown in FIG. 9, the first cable cartridge 102 can be split into two sections, e.g., divided by line 186. The sections can include a forward section 188 and a rear section 190. The forward section 188 and the rear section 190 can be arranged or connected together as shown in FIG. 9 (i.e., slid into contact with one another within the rack, and in some embodiments, locked together with a lock or retention device). For servicing one or both of the forward and rear sections 188, 190, one or both of the forward and rear sections 188, 190 can be slid out from the rack, e.g., along the first direction X. In some embodiments, the forward section 188 and the rear section 190 can be removed from the rack via the front side 106 (FIG. 1) and the rear side 108 (FIG. 1), respectively. Stated differently, the forward section 188 and the rear section 190 can be disconnected from one another, if connected, and then slid out from the rack away from each other, with the forward section 188 being moved forward along the first direction X and the rear section 190 being moved rearward along the first direction X. In this way, the forward section 188 and the rear section 190 are movable relative to one another. Dividing the first cable cartridge 102 into sections (or any other side cable cartridge of the present disclosure) can provide for a smaller field-replaceable unit (FRU) for service. This feature can be enabled with cable crossovers (flyover swizzle) within trays.

Returning to FIGS. 1, 2, and 3, in some embodiments, the switch trays 124 are connected to the compute trays 122 to form a high-speed network in the rack 100. Put differently, the switch trays 124 can form an internal network in the rack 100 so that each compute tray 122 can communicate with multiple other compute trays 122 via the switch trays 124. In one embodiment, the switch trays 124 interconnect the compute trays 122 so that every compute tray 122 can communicate with every other compute tray 122. This may be especially advantageous when the compute trays 122 are tasked with performing a high compute task, such as an artificial intelligence or machine learning task.

As discussed above, a rear side 108 of the rack 100 may not have sufficient area for attaching cables from the compute trays 122 to the switch trays 124. Moreover, even if there is sufficient room on the rear side 108, the length of the flyover cables used to connect compute elements at the front of the trays to connectors at the back of the trays, and then the cables to connect the compute trays to the switch trays, may have a length that seriously degrades the signal quality, e.g., the signal eye. As such, it may be impossible or unfavorable to use passive wire (e.g., copper) DP cables to interconnect the trays at the rear side 108. However, using powered wire cables or optical cables may significantly increase costs.

Instead, in accordance with embodiments presented herein, the cables 178 used to couple the compute trays 122 to the switch trays 124 are placed at one (or both) of the sides of the rack 100. In the example of FIGS. 1, 2, and 3, the rack 100 includes the first and second cable cartridges 102, 104 arranged on the first and second sides 110, 112 of the rack 100, respectively. The cables 178 are contained within the first and second cable cartridges 102, 104 and couple the compute trays 122 to the switch trays 124. Each one of the cables 178 in a cable cartridge can connect a pair of the connectors 176 in that cable cartridge, where these connectors 176 of the pair in turn mate with respective ones of the side connectors 156, 162 disposed on the sides of the trays 120, e.g., with one connector of the pair mating with a side connector of a compute tray and the other connector of the pair mating with a side connector of a switch tray. In at least some embodiments, the first cable cartridge 102 can include one cable for every pair of connectors 176 therein, and similarly, the second cable cartridge 104 can include one cable for every pair of connectors 176 therein. While only two (2) cables 178 are shown in FIG. 3 and also in FIG. 7, it will be appreciated that many cables can be arranged within the first and second cable cartridges 102, 104, e.g., so that each pair of connectors 176 has an associated cable connecting them.

In some embodiments, every compute tray 122 is connected to every one of the switch trays 124 where the cables 178 are contained within the first and second cable cartridges 102, 104. In some further embodiments, each compute element (e.g., each GPU) of each one of the compute trays 122 is connected to each one of the switch trays 124 with at least some of the cables 178 connecting these elements being contained within the first and second cable cartridges 102, 104.

Further, although not shown, the compute trays 122 and the switch trays 124 can be connected to other compute elements (not in the rack 100) using the front side 106 or the rear side 108, such as another, external network. Further, while FIGS. 1, 2, and 3 illustrate using the sides 110, 112 to route at least some of the cables 178 interconnecting the compute trays 122 and the switch trays 124, in other embodiments, some of the cables 178 interconnecting the compute trays 122 and the switch trays 124 may be disposed at the rear side 108 and the front side 106. In any case, FIGS. 1, 2, 3 illustrates that using the cable cartridges can shorten the cables which permit the trays 120 to be interconnected using passive wire DP cables, instead of active (powered) wire cables, or optical cables.

While FIGS. 1, 2, and 3 illustrate an embodiment where the compute trays 122 are coupled to switch trays 124, in other embodiments, the side-cabling techniques discussed above can apply to a rack that includes trays of the same type (e.g., compute trays 122 that are interconnected to each other). Further, the rack can include more than two types of trays. For example, in some embodiments, the rack can include the compute trays 122, switch trays 124, and data storage trays which are also connected to the switch trays to provide local (rack level) storage for the compute trays 122.

In some further embodiments, the concepts described above can be scaled to multi-stack racks or multi-rack systems. Examples are provided below.

Figures 10, 11:
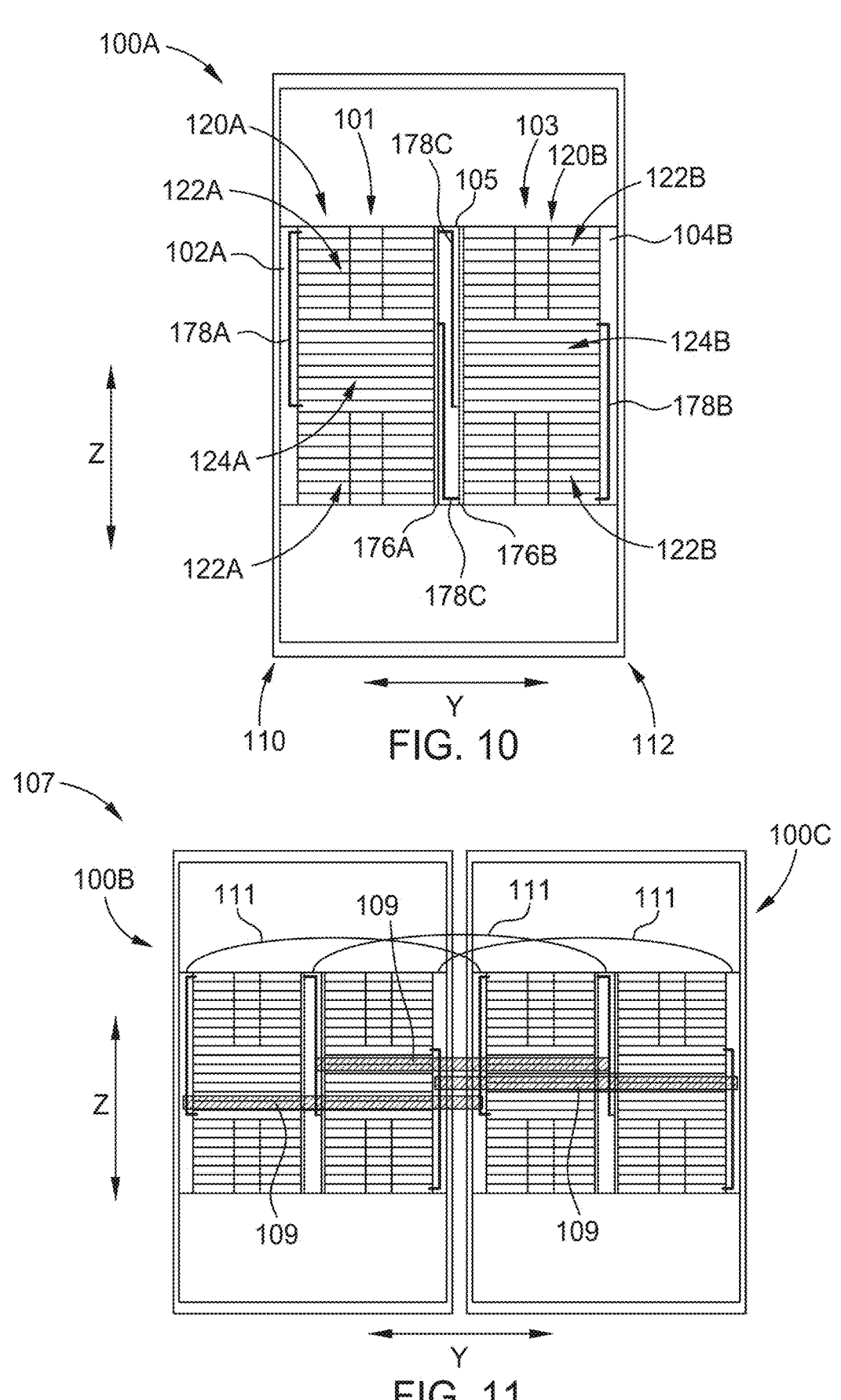
FIG. 10 illustrates a front view of a multi-stack rack according to an example embodiment of the present disclosure.
FIG. 11 illustrates a front view of a multi-rack system according to an example embodiment of the present disclosure.

FIG. 10 illustrates a front view of a rack 100A, which is a multi-stack rack having a first stack 101 and a second stack 103 in a side-by-side arrangement. The first stack 101 can include a first plurality of trays 120A mounted on the rack 100A while the second stack 103 can include a second plurality of trays 120B mounted on the rack 100A. In this example, the first stack 101 includes eight (8) compute trays 122A (each containing four GPUs) disposed above eight (8) switch trays 124A and eight (8) compute trays 122A (each containing four GPUs) disposed below the eight (8) switch trays 124A. Similarly, the second stack 103 includes eight (8) compute trays 122B (each containing four GPUs) disposed above eight (8) switch trays 124B and eight (8) compute trays 122B (each containing four GPUs) disposed below the eight (8) switch trays 124B. The rack 100A can store one hundred twenty-eight (128) GPUs (with 4 GPUs per compute tray, with a total of 32 compute trays). While FIG. 10 specifically mentions GPUs, as above, the compute trays 122A, 122B can store any kind of computing element.

The rack 100A also includes a plurality of cable cartridges, including a first cable cartridge 102A, a second cable cartridge 104B, and one or more stack-interconnecting cable cartridges. The first cable cartridge 102A includes connectors configured to connect to connectors on sides of the first plurality of trays 120A and cables 178A (only one (1) shown in FIG. 10) connected to the connectors in the first cable cartridge to facilitate communication between the first plurality of trays 120A. The first cable cartridge 102A is disposed at the first side 110 of the rack 100A. The second cable cartridge 104B includes connectors configured to connect to connectors on sides of the second plurality of trays 120B and cables 178B (only one (1) shown in FIG. 10) connected to the connectors in the second cable cartridge 104B to facilitate communication between the second plurality of trays 120B. The second cable cartridge 104B is disposed at the second side 112 of the rack 100A.

The one or more stack-interconnecting cable cartridges are disposed between the first stack 101 and the second stack 103, e.g., along the second direction Y. In some embodiments, such as in the embodiment of FIG. 10, the rack 100A can include a single stack-interconnecting cable cartridge 105 disposed between the first and second stacks 101, 103 (e.g., in the middle between the first and second stacks 101, 103). The stack-interconnecting cable cartridge 105 can include a plurality of first stack connectors 176A and a plurality of second stack connectors 176B with an interior volume being defined therebetween. The first stack connectors 176A are configured to connect to connectors on sides of the first plurality of trays 120A while the second stack connectors 176B are configured to connect to connectors on sides of the second plurality of trays 120B. Interconnect cables 178C can each connect one of the first stack connectors 176A with one of the second stack connectors 176B.

Accordingly, the stack-interconnecting cable cartridge 105 can facilitate the connection of at least one of the first plurality of trays 120A in the first stack 101 to at least one of second plurality of trays 120B in the second stack 103. For instance, the stack-interconnecting cable cartridge 105 can permit compute trays in one stack to connect to switch trays in the other stack. Although not shown, the stack-interconnecting cable cartridge 105 can also permit compute trays to connect to switch trays in the same stack. In one embodiment, the first and second cable cartridges 102A, 104B on the first side 110 (e.g., the left side) and the second side 112 (e.g., the right side), respectively, can be used only to communicatively couple compute trays and switch trays in the same stack, while the stack-interconnecting cable cartridge 105 can facilitate interconnection between the first and second stacks 101, 103.

The side-by-side arrangement of the embodiment of FIG. 10 can permit the first and second stacks 101, 103 to form an internal network. That is, to the perspective of the compute trays 122A, 122B, they are part of the same network even though they may be in different vertical stacks. In one embodiment, the switch trays 124A, 124B interconnect the compute trays 122A, 122B in both vertical stacks so that every compute tray can communicate with every other compute tray in the two stacks. This may be especially advantageous when the GPUs are tasked with performing a high compute task, such as an artificial intelligence or machine learning task. Moreover, the arrangement of the rack 100A advantageously allows for scaling to multiple stacks without or with a reduced need to increase cable length. The interconnect cables 178C can be the same or approximately the same length as the cables 178A, 178B.

In some alternative embodiments, the rack 100A can include two stack-interconnecting cable cartridges disposed between the first and second stacks 101, 103. One stack-interconnecting cable cartridge can include the first stack connectors 176A while the other stack-interconnecting cable cartridge can include the second stack connectors 176B. The two stack-interconnecting cable cartridges can be mated together to form the interior volume defined between the first stack connectors 176A and the second stack connectors 176B. In such embodiments, the stack-interconnecting cable cartridges can each be arranged to have openings that communicate with one another, e.g., to permit the interconnect cables 178C or other cables to travel through the interior volume, e.g., from one stack to another.

FIG. 11 illustrates a front view of multi-rack system 107 that includes a first rack 100B and a second rack 100C, both of which are arranged in a same or similar manner as the rack 100A of FIG. 10. Accordingly, the rack 100A of FIG. 10 having one hundred twenty-eight (128) GPUs is doubled to a two hundred fifty-six (256) GPU arrangement in FIG. 11 using two racks so that there are four vertical stacks, where each vertical stack includes eight compute trays (each containing four GPUs) disposed above, and eight compute trays disposed below, eight switch trays. Moreover, the racks 100B, 100C can each include first and second cable cartridges and one or more stack-interconnecting cable cartridges.

In addition, horizontal cable cartridges 109 can be added to interconnect the switch trays in the four vertical stacks. In some embodiments, one horizontal cable cartridge 109 can interconnect the first cable cartridge of the first rack 100B with the first cable cartridge of the second rack 100C, one horizontal cable cartridge 109 can interconnect the second cable cartridge of the first rack 100B with the second cable cartridge of the second rack 100C, and one horizontal cable cartridge 109 can interconnect the one or more stack-interconnecting cable cartridges of the first rack 100B with the one or more stack-interconnecting cable cartridges of the second rack 100C, e.g., as shown in FIG. 11.

Moreover, additionally or alternatively, active cables 111 can be used to interconnect the cable cartridges in different stacks. For example, passive electrical DP cables can be used in the vertical and horizontal cable trays, but it may be advantageous to use active (powered) cables 111 to interconnect the vertical cable trays due to the length of these cables and the significant attenuation that may occur if passive wire cables were used. In some embodiments, an active cable 111 can interconnect the first cable cartridge of the first rack 100B with the first cable cartridge of the second rack 100C, an active cable 111 can interconnect the second cable cartridge of the first rack 100B with the second cable cartridge of the second rack 100C, and an active cable 111 can interconnect the one or more stack-interconnecting cable cartridges of the first rack 100B with the one or more stack-interconnecting cable cartridges of the second rack 100C, e.g., as shown in FIG. 11.

The side-by-side arrangement of the embodiment of FIG. 11 permits the four vertical stacks to form an internal network. That is, to the perspective of the compute trays, they are part of the same network even though they may be in different vertical stacks. In one embodiment, the switch trays interconnect the compute trays in both vertical stacks so that every compute tray can communicate with every other compute tray in the two stacks, and the horizontal cable cartridges 109 and/or the active cables 111 can interconnect the two racks 100B, 100C.

Figure 12:
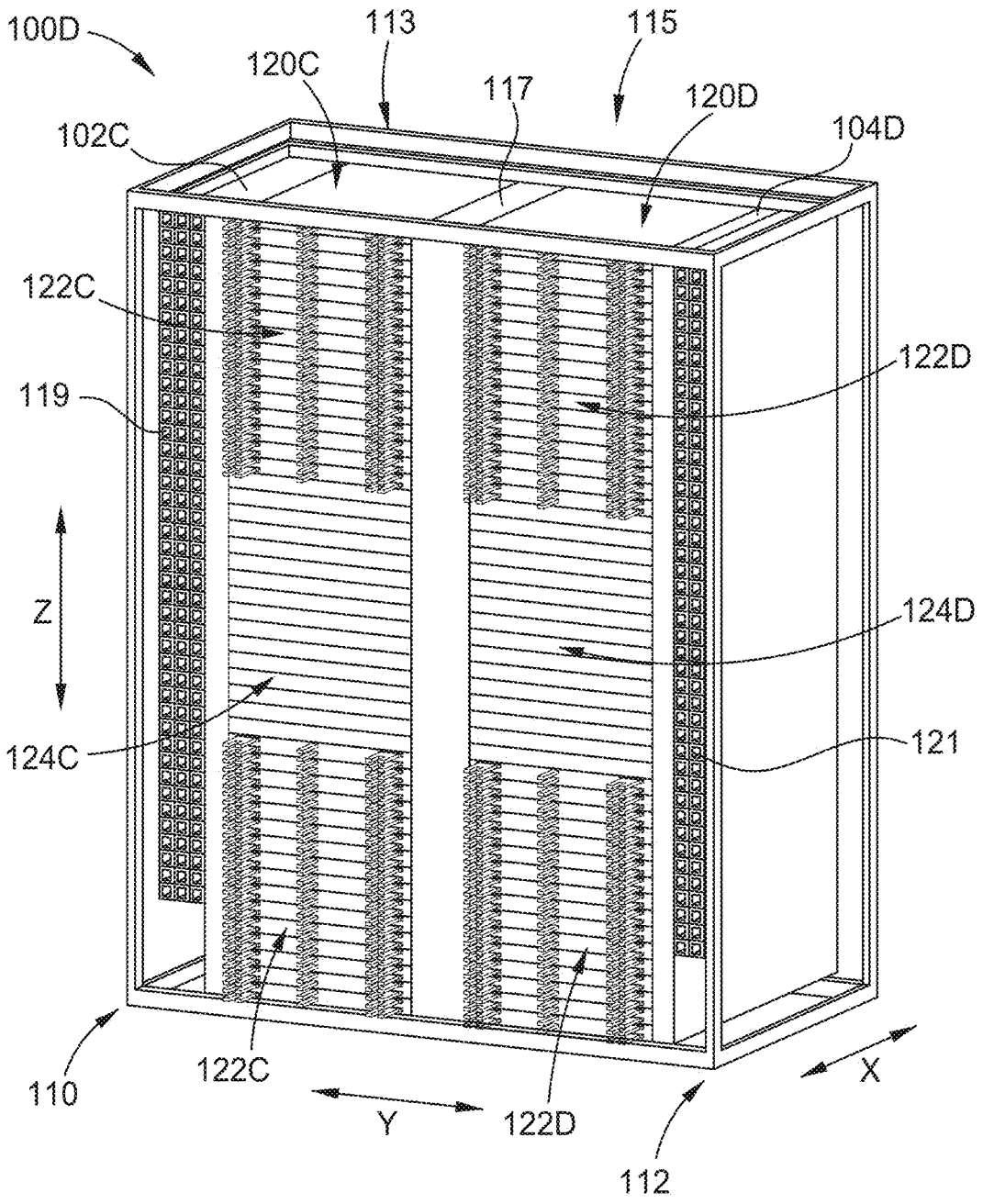
FIG. 12 illustrates a perspective view of a multi-stack rack according to an example embodiment of the present disclosure.

FIG. 12 illustrates a perspective view of a rack 100D, which is a multi-stack rack having a first stack 113 and a second stack 115 in a side-by-side arrangement. The first stack 113 can include a first plurality of trays 120C mounted on the rack 100D while the second stack 115 can include a second plurality of trays 120D mounted on the rack 100D. In this example, the first stack 113 includes sixteen (16) compute trays 122C (each containing four GPUs) disposed above sixteen (16) switch trays 124C and sixteen (16) compute trays 122C (each containing four GPUs) disposed below the sixteen (16) switch trays 124C. Similarly, the second stack 115 includes sixteen (16) compute trays 122D (each containing four GPUs) disposed above sixteen (16) switch trays 124D and sixteen (16) compute trays 122D (each containing four GPUs) disposed below the sixteen (16) switch trays 124D. The rack 100D can store 256 GPUs (with 4 GPUs per compute tray, with a total of 64 compute trays), with two 128 GPU stacks disposed adjacent to one another and arranged together in the same rack. While FIG. 12 specifically mentions GPUs, as above, the compute trays 122C, 122D can store any kind of computing element.

Moreover, the rack 100D includes first and second cable cartridges 102C, 102D and one or more stack-interconnecting cable cartridges 117, much like the embodiment of FIG. 10. The first cable cartridge 102C is disposed at the first side 110 of the rack 100D, the second cable cartridge 104D is disposed at the second side 112 of the rack 100D, and the one or more stack-interconnecting cable cartridges 117 are disposed between the two vertical stacks. Each cable cartridge 102C, 104D, 117 can include connectors and cables as described above with respect to the embodiment of FIG. 10. The one or more stack-interconnecting cable cartridges 117 can permit compute trays in one stack to connect to switch trays in the other stack. In some embodiments, the one or more stack-interconnecting cable cartridges 117 can also permit compute trays to connect to switch trays in the same stack. In one embodiment, the cable cartridges on the first and second sides 110, 112 can be used only to communicatively couple compute trays and switch trays in the same stack.

Further, for the embodiment of FIG. 12, a taller rack (e.g., a 48OU rack) may be used than the embodiment of FIG. 11. Moreover, the cables in the cable cartridges may be around 0.8 m longer than an embodiment were each vertical stack has only 16 compute trays and 8 switch trays. In one embodiment, first and second power and management connections 119, 121 can be arranged on the first and second sides 110, 112 of the rack 100D, respectively.

Actuation Techniques

Different actuation techniques for coupling connectors in a tray to connectors in a cable cartridge will now be described. Generally, in some embodiments, one set of connectors can be moved or actuated while the other set of connectors can be fixed. The movable connectors can be on the tray while the fixed connectors can be in the cable cartridge, or vice versa. In some embodiments, both sets of connectors can be moved or actuated. That is, the set of connectors of the tray and the set of connectors of the cable cartridge can both be movable connectors. Example embodiments are provided below.

Figure 13A:
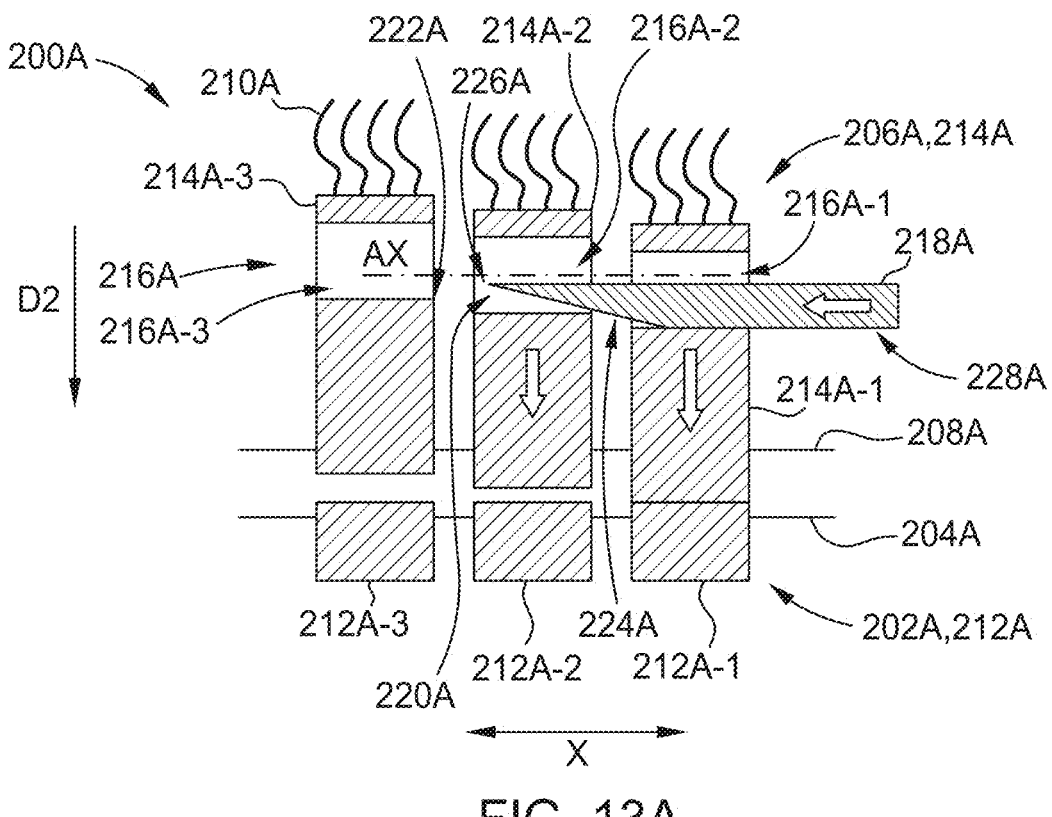
FIGS. 13A and 13B illustrate an actuation system for coupling connectors in a tray to connectors in a cable cartridge according to an example embodiment of the present disclosure.

With reference now to FIG. 13A, an actuation system 200A for mating respective pairs of connectors is provided. As depicted, the actuation system 200A includes a first set of electrical connectors 202A disposed on a side of a tray 204A along a first direction X, wherein the tray 204A is configured to mount in a rack, such as any of the racks disclosed herein. The first set of electrical connectors 202A can be arranged in a sidewall of the tray 204A, for example. The actuation system 200A also includes a second set of electrical connectors 206A. The second set of electrical connectors 206A can be disposed in a cable cartridge 208A, such as a side cable cartridge. One or more cables 210A can be coupled with each electrical connector of the second set of electrical connectors 206A. The second set of electrical connectors 206A can be aligned with the first set of electrical connectors 202A along the first direction X. For instance, the tray 204A can be slid into a rack and the cable cartridge 208A can be slid into the rack as well so as to be in an engaged position with respect to the tray 204A, e.g., so that the connectors respectively align.

One of the first and second sets of electrical connectors 202A, 206A includes actuated connectors while the other set includes fixed connectors. In the embodiment of FIG. 13A, the first set of electrical connectors 202A includes fixed connectors 212A, including a first fixed connector 212A-1, a second fixed connector 212A-2, and a third fixed connector 212A-3. The fixed connectors 212A are spaced from one another along the first direction X. The second set of electrical connectors 206A includes actuated connectors 214A, including a first actuated connector 214A-1, a second actuated connector 214A-2, and a third actuated connector 214A-3. The actuated connectors 214A are spaced from one another along the first direction X, and in FIG. 13A, the first, second, and third actuated connectors 214A-1, 214A-2, 214A-3 are aligned with the first, second, and third fixed connectors 212A-1, 212A-2, 212A-3 along the first direction X, respectively. In other embodiments, the first set of electrical connectors 202A can include actuated connectors and the second set of electrical connectors 206A can include fixed connectors.

Each one of the actuated connectors 214A can be moved between an extended position and a retracted position. When in the extended position, an actuated connector can be extended so as to engage or mate with a corresponding fixed connector. When in the retracted position, the actuated connector can be retracted so as to be disengaged or not in mating communication with a corresponding fixed connector. For instance, in FIG. 13A, the first actuated connector 214A-1 is in an extended position and mated with the first fixed connector 212A-1 while the third actuated connector 214A-3 is in a retracted position and not mated with the third fixed connector 212A-3. The second actuated connector 214A-2 is in an intermediate position between the extended position and the retracted position.

As shown in FIG. 13A, the actuated connectors 214A include connection elements 216A to be used to extend the actuated connectors 214A to mate with the fixed connectors 212A. In some embodiments, such as in the embodiment of FIG. 13A, the connection elements 216A include a respective slot in each of the actuated connectors 214A, with the respective slots being aligned along a first axis AX. That is, the slots are aligned with the first axis AX in that they allow for a tool 218A, such as an actuation spear, to be inserted therethrough along the first axis AX, which is parallel with the first direction X. For instance, the first actuated connector 214A-1 includes a first slot 216A-1, the second actuated connector 214A-2 includes a second slot 216A-2, and the third actuated connector 214A-3 includes a third slot 216A-3. The first, second, and third slots 216A-1, 216A-2, 216A-3 are aligned with the first axis AX in that the tool 218A can be inserted therethrough along the first axis AX, e.g., to move or actuate the actuated connectors 214A. Each slot can be aligned with the first axis AX regardless of whether a given slot is in an extended position, a retracted position, or some position therebetween.

In some embodiments, the first, second, and third slots 216A-1, 216A-2, 216A-3 are configured to receive the tool 218A having a sloped tip 220A. The tool 218A can be moved through the first, second, and third slots 216A-1, 216A-2, 216A-3 so that the sloped tip 220A sequentially engages with the actuated connectors 214A to move them in a direction D2 towards the fixed connectors 212A, with the direction D2 being perpendicular to the first direction X. In some embodiments, the sloped tip 220A can sequentially engage the actuated connectors 214A (e.g., respective first surfaces 222A or first edges of each of the actuated connectors 214A). In this regard, in some embodiments, the connection elements 216A are configured such that pairs of the first and second sets of electrical connectors 202A, 206A are mated sequentially along the first direction X.

Specifically, as shown in FIG. 13A, the tool 218A can be inserted manually (from right to left in FIG. 13A) into the slots 216A-1, 216A-2, 216A-3, which moves the actuated connectors 214A along the direction D2 towards the fixed connectors 212A (which can be male and female connectors, respectively) to mate each pair of connectors. For example, the sloped tip 220A arranged at a tip of the tool 218A can be used to move the actuated connectors 214A towards the fixed connectors 212A. Particularly, to move a given one of the actuated connectors 214A from the retracted position to the extended position, as the tool 218A is moved along the first direction X (e.g., from right to left in FIG. 13A) a sloped surface 224A of the sloped tip 220A can engage a first surface 222A of the given actuated connector, and as the tool 218A is moved further along the first direction X (e.g., further to the left in FIG. 13A), the first surface 222A slides along the sloped surface 224A away from a leading edge 226A of the tool 218A. This action moves the given actuated connector toward its corresponding fixed connector along the direction D2. Eventually, the given actuated connector is moved to the extended position and in mating engagement with its corresponding fixed connector. Once the tool 218A has moved the given actuated connector to the extended position, a planar surface 228A of the tool 218A can engage the given actuated connector while the sloped surface 224A of the tool 218A no longer contacts the given actuated connector. Moreover, the tool 218A can continue to be moved along the first direction X to actuate other actuated connectors to the extended position.

Accordingly, the manual actuation of the tool 218A works like a zipper, where the actuated connectors 214A are actuated individually or at least mated at different times with their corresponding fixed connectors 212A. This can be advantageous since less force can be applied to the actuated connectors 214A when mating, relative to a technique that mates the connectors on the same tray at the same time (i.e., in parallel).

Figure 13B:
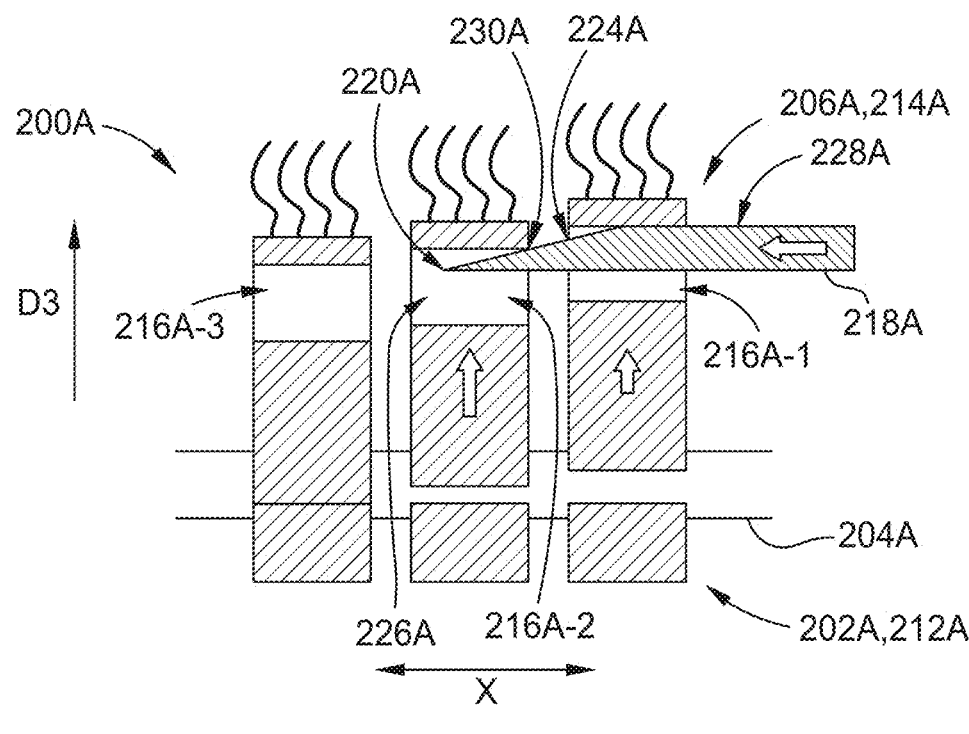

FIG. 13B illustrates that the tool 218A can be used to reverse the mating process or decoupling of the connectors. As depicted, the sloped tip 220A of the tool 218A can push (when again inserted from right to left) the actuated connectors 214A away from the fixed connectors 212A. For the decoupling process, the tool 218A can be inverted (with respect to its position for the coupling process as shown in FIG. 13A) so that the sloped surface 224A faces away from the fixed connectors 212A. The tool 218A can be moved along the first direction X (e.g., from right to left in FIG. 13B) to sequentially move or actuate the actuated connectors 214A.

Particularly, as shown in FIG. 13B, the tool 218A can be inserted manually (from right to left in FIG. 13A) into the slots 216A-1, 216A-2, 216A-3, which moves the actuated connectors 214A along a direction D3 away from the fixed connectors 212A to disengage each pair of connectors. Particularly, to move a given one of the actuated connectors 214A from the extended position to the retracted position, as the tool 218A is moved along the first direction X (e.g., from right to left in FIG. 13B) the sloped surface 224A of the sloped tip 220A can engage a second surface 230A of the given actuated connector, and as the tool 218A is moved further along the first direction X (e.g., further to the left in FIG. 13B), the second surface 230A slides along the sloped surface 224A away from the leading edge 226A of the tool 218A. This action moves the given actuated connector away from its corresponding fixed connector along the direction D3. Eventually, the given actuated connector is moved to the retracted position. Once the tool 218A has moved the given actuated connector to the retracted position, the planar surface 228A of the tool 218A can engage the given actuated connector while the sloped surface 224A of the tool 218A no longer contacts the given actuated connector. Moreover, the tool 218A can continue to be moved along the first direction X to actuate other actuated connectors to the retracted position. Accordingly, the manual actuation of the tool 218A works like a zipper in the reverse direction, where the actuated connectors 214A are actuated individually at different times away from their corresponding fixed connectors 212A. This can be advantageous since less force can be applied to the actuated connectors 214A to disengage them, relative to a technique that disengages the connectors on the same tray at the same time (i.e., in parallel).

Figure 14A:
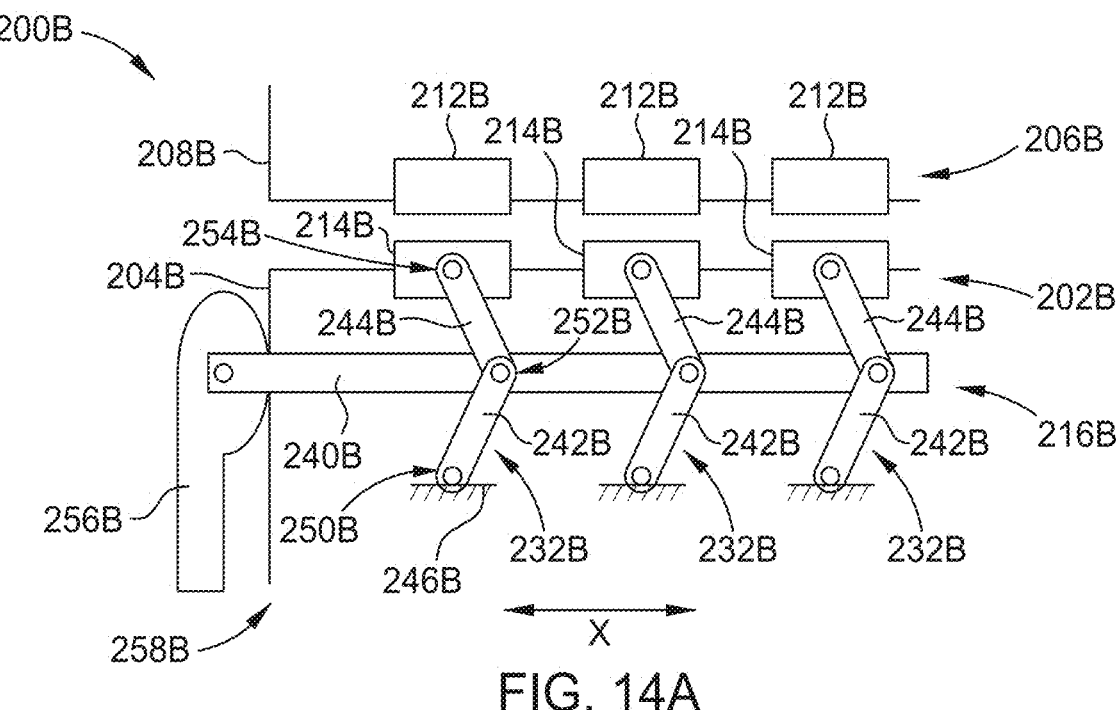
FIGS. 14A and 14B illustrate an actuation system for coupling connectors in a tray to connectors in a cable cartridge according to an example embodiment of the present disclosure.

With reference now to FIG. 14A, an actuation system 200B for mating respective pairs of connectors is provided. As illustrated, the actuation system 200B includes a first set of electrical connectors 202B disposed on a side of a tray 204B along a first direction X, wherein the tray 204B is configured to mount in a rack, such as any of the racks disclosed herein. The first set of electrical connectors 202B can be arranged in a sidewall of the tray 204B, for example. The actuation system 200B also includes a second set of electrical connectors 206B. The second set of electrical connectors 206B can be disposed in a cable cartridge 208B, such as a side cable cartridge. One or more cables can be coupled with each electrical connector of the second set of electrical connectors 206B. The second set of electrical connectors 206B can be aligned with the first set of electrical connectors 202B along the first direction X.

One of the first and second sets of electrical connectors 202B, 206B includes actuated connectors while the other set includes fixed connectors. In the embodiment of FIG. 14A, the first set of electrical connectors 202B includes actuated connectors 214B. The actuated connectors 214B are spaced from one another along the first direction X. The second set of electrical connectors 206B includes fixed connectors 212B. The fixed connectors 212B are spaced from one another along the first direction X. In other embodiments, the first set of electrical connectors 202B can include fixed connectors and the second set of electrical connectors 206B can include actuated connectors.

Each one of the actuated connectors 214B can be moved between an extended position and a retracted position. When in the extended position, an actuated connector can be extended so as to engage or mate with a corresponding fixed connector. When in the retracted position, the actuated connector can be retracted so as to be disengaged or not in mating communication with a corresponding fixed connector. For instance, in FIG. 14A, each of the actuated connectors 214B are in a retracted position. In contrast, in FIG. 14B, each of the actuated connectors 214B are in an extended position.

Figure 14B:
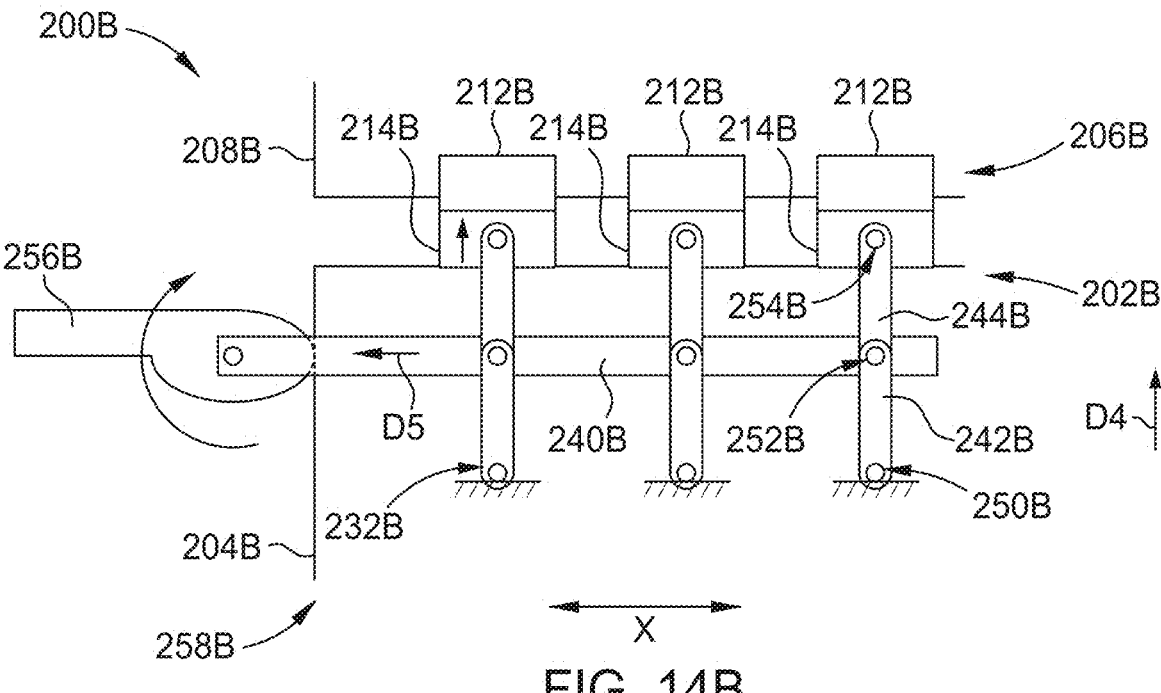

As shown in FIG. 14A, the actuated connectors 214B include connection elements 216B to be used to extend the actuated connectors 214B to mate with the fixed connectors 212B. In some embodiments, such as in the embodiment of FIG. 14A, the connection elements 216B include a plurality of arms 232B coupled to a bar 240B. When the bar 240B is actuated in a direction along the first direction X, the plurality of arms 232B move the actuated connectors 214B in a direction towards the fixed connectors 212B, or rather a direction D4 as shown in FIG. 14B.

More specifically, each of the plurality of arms 232B includes a first linkage 242B and a second linkage 244B, or rather, a structure-to-bar linkage and a bar-to-connector linkage. The first linkage 242B of a given arm couples the bar 240B with a fixed structure 246B. One end of the first linkage 242B can be pivotably coupled (e.g., by a pin) with the fixed structure 246B at a structure connection point 250B so that first linkage 242B can pivot or rotate when the bar 240B is moved. The other end of the first linkage 242B is coupled with the bar 240B (e.g., by a pin) at a bar connection point 252B. The second linkage 244B of the given arm couples the bar 240B with one of the actuated connectors 214B. One end of the second linkage 244B can be pivotably coupled (e.g., by a pin) with the actuated connector 214B at a connector connection point 254B so that second linkage 244B can pivot or rotate when the bar 240B is moved. The other end of the second linkage 244B is coupled with the bar 240B (e.g., by a pin) at the bar connection point 252B. In some embodiments, a single pin can couple the first and second linkages 242B, 244B of the given arm with the bar 240B at the bar connection point 252B. In other embodiments, the first and second linkages 242B, 244B can be coupled with the bar at separate bar connection points.

To move the actuated connectors 214B from the retracted position to the extended position (e.g., from their positions in FIG. 14A to their positions in FIG. 14B), a lever 256B coupled with the bar 240B can be moved (e.g., rotated manually or by an automated mechanism, such as an electric motor) to pull the bar 240B towards a front side 258B of the tray 204B (or alternatively the rear side of the tray 204B). In this way, the bar 240B can be moved in a direction D5 along the first direction X. The arms 232B coupled to the bar 240B straighten as the lever 256B is actuated. That is, the movement of the bar 240B in the direction D5 drives the bar connection points 252B of the arms 232B to align with their respective structure connection points 250B and their respective connector connection points 254B, which straightens the first and second linkages 242B, 244B as shown in FIG. 14B (in contrast, in FIG. 14A, the bar connection points 252B of the arms 232B are offset from their respective structure connection points 250B and their respective connector connection points 254B). Accordingly, the movement of the bar 240B moves the actuated connectors 214B toward the fixed connectors 212B so that they mate with the fixed connectors 212B, e.g., as shown in FIG. 14B. In some embodiments, such as in the embodiment of FIGS. 14A and 14B, the connection elements 216B are configured such that pairs of the first and second sets of electrical connectors 202B, 206B are mated in parallel along the first direction X, or rather, at the same time.

To move the actuated connectors 214B from the extended position to the retracted position (e.g., from their positions in FIG. 14B to their positions in FIG. 14A), the process described above can be reversed. The lever 256B coupled with the bar 240B can be moved (e.g., rotated manually or by an automated mechanism, such as an electric motor) to push the bar 240B away from the front side 258B of the tray 204B. In this way, the bar 240B can be moved in a direction opposite the direction D5 along the first direction X. The arms 232B coupled to the bar 240B become less straight as the lever 256B is actuated. That is, the movement of the bar 240B in the direction opposite the direction D5 drives the bar connection points 252B of the arms 232B out of or further out of alignment with their respective structure connection points 250B and their respective connector connection points 254B. Accordingly, the movement of the bar 240B in the direction opposite the direction D5 moves the actuated connectors 214B away from the fixed connectors 212B. In some embodiments, such as in the embodiment of FIGS. 14A and 14B, the connection elements 216B are configured such that pairs of the first and second sets of electrical connectors 202B, 206B are disengaged in parallel, or rather, at the same time.

Figure 15A:
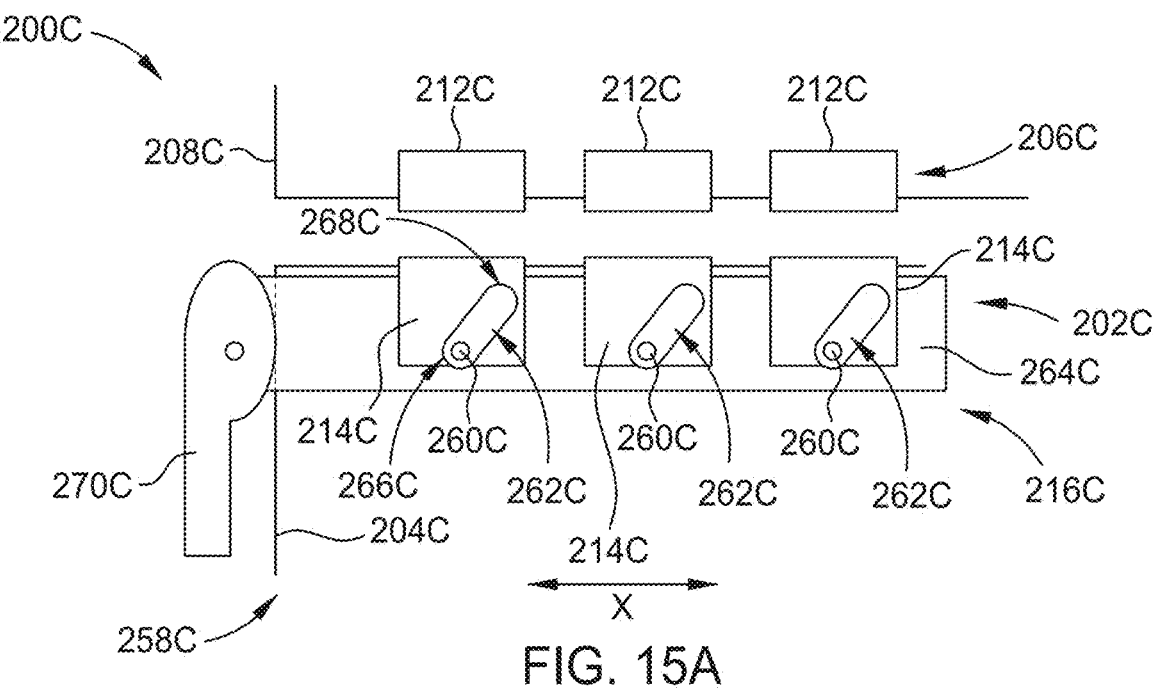
FIGS. 15A and 15B illustrate an actuation system for coupling connectors in a tray to connectors in a cable cartridge according to an example embodiment of the present disclosure.

With reference now to FIG. 15A, an actuation system 200C for mating respective pairs of connectors is provided. As shown, the actuation system 200C includes a first set of electrical connectors 202C disposed on a side of a tray 204C along a first direction X, wherein the tray 204C is configured to mount in a rack, such as any of the racks disclosed herein. The first direction X can extend along the first direction X (FIG. 1), for example. The first set of electrical connectors 202C can be arranged in a sidewall of the tray 204C, for example. The actuation system 200C also includes a second set of electrical connectors 206C. The second set of electrical connectors 206C can be disposed in a cable cartridge 208C, such as a side cable cartridge. One or more cables can be coupled with each electrical connector of the second set of electrical connectors 206C. The second set of electrical connectors 206C can be aligned with the first set of electrical connectors 202C along the first direction X.

One of the first and second sets of electrical connectors 2020, 206C includes actuated connectors while the other set includes fixed connectors. In the embodiment of FIG. 15A, the first set of electrical connectors 202C includes actuated connectors 214C. The actuated connectors 214C are spaced from one another along the first direction X. The second set of electrical connectors 206C includes fixed connectors 212C. The fixed connectors 212C are spaced from one another along the first direction X. In other embodiments, the first set of electrical connectors 202C can include actuated connectors and the second set of electrical connectors 2060 can include fixed connectors.

Each one of the actuated connectors 214C can be moved between an extended position and a retracted position. When in the extended position, an actuated connector can be extended so as to engage or mate with a corresponding fixed connector. When in the retracted position, the actuated connector can be retracted so as to be disengaged or not in mating communication with a corresponding fixed connector. For instance, in FIG. 15A, each of the actuated connectors 214C are in a retracted position. In contrast, in FIG. 15B, each of the actuated connectors 214C are in an extended position.

As shown in FIG. 15A, the actuated connectors 214C include connection elements 216C to be used to extend the actuated connectors 214C to mate with the fixed connectors 212C. In some embodiments, such as in the embodiment of FIG. 15A, the connection elements 216C include a plurality of connector pins 260C that are slidably received within respective slots 262C in a bar 264C. When the bar 264C is actuated in a direction D6 along the first direction X, the plurality of connector pins 260C move in the respective slots 262C to move the actuated connectors 214C in a direction D7 towards the fixed connectors 212C.

The slots 262C of the bar 264C are spaced apart from one another, e.g., along the first direction X, and are defined at an angle relative to the first direction X, e.g., at forty-five degrees (45°) with respect to the first direction X. Each one of the slots 262C is elongated and has a first end 266C and a second end 268C. The connector pins 260C can be slidably received within respective ones of the slots 262C. The connector pins 260C are rigidly attached to their respective actuated connectors 214C.

Figure 15B:
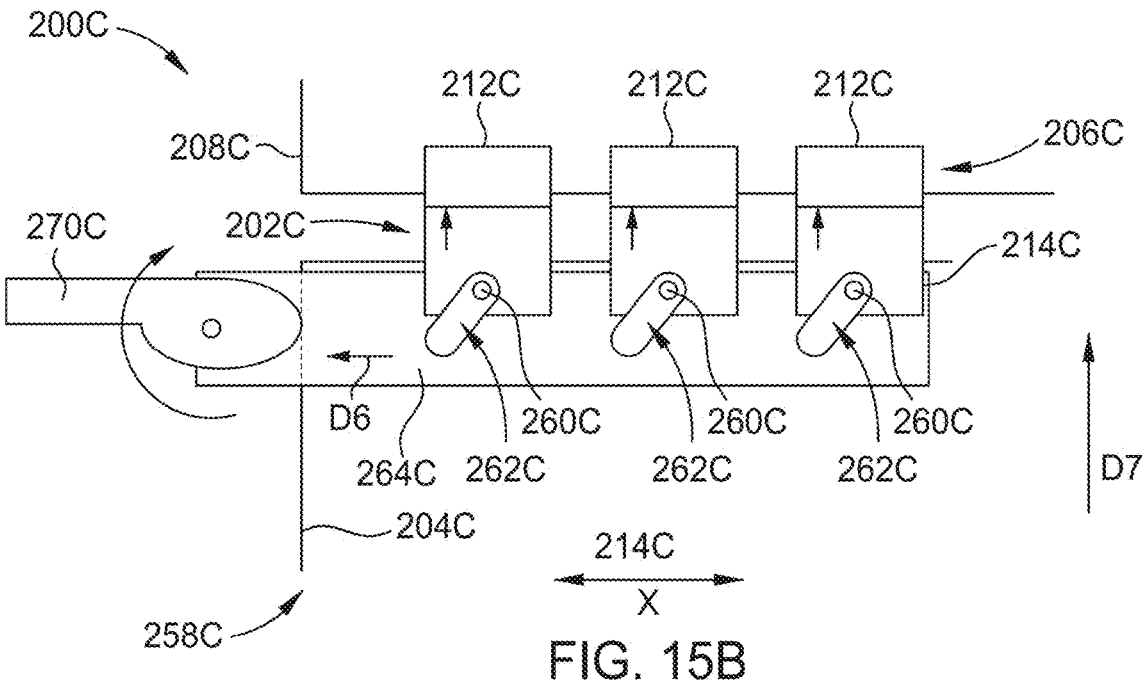

To move the actuated connectors 214C from the retracted position to the extended position (e.g., from their positions in FIG. 15A to their positions in FIG. 15B), a lever 270C coupled with the bar 264C can be moved (e.g., rotated manually or by an automated mechanism, such as an electric motor) to pull the bar 264C towards a front side 258C of the tray 204C (or alternatively the rear side of the tray 204C). In this way, the bar 264C can be moved in the direction D6 along the first direction X. When the bar 264C is moved toward the front side 258C, the connector pins 260C are slid within their respective slots 262C, e.g., from the first end 266C to the second end 268C of their respective slots 262C, or rather, from their positions in FIG. 15A to their positions in FIG. 15B. This action moves the actuated connectors 214C toward the fixed connectors 212C so that they mate with the fixed connectors 212C, e.g., as shown in FIG. 15B. In some embodiments, such as in the embodiment of FIGS. 15A and 15B, the connection elements 216C are configured such that pairs of the first and second sets of electrical connectors 202C, 206C are mated in parallel along the first direction X, or rather, at the same time.

To move the actuated connectors 214C from the extended position to the retracted position (e.g., from their positions in FIG. 15B to their positions in FIG. 15A), the process described above can be reversed. The lever 270C coupled with the bar 264C can be moved (e.g., rotated manually or by an automated mechanism, such as an electric motor) to push the bar 264C away from the front side 258C of the tray 204C. In this way, the bar 264C can be moved in a direction opposite the direction D6 along the first direction X. When the bar 264C is moved in a direction opposite the direction D6, the connector pins 260C are slid within their respective slots 262C, e.g., from the second end 268C to the first end 266C of their respective slots 262C, or rather, from their positions in FIG. 15B to their positions in FIG. 15A. This action moves the actuated connectors 214C away from the fixed connectors 212C so that they disengage from the fixed connectors 212C. In some embodiments, such as in the embodiment of FIGS. 15A and 15B, the connection elements 216C are configured such that pairs of the first and second sets of electrical connectors 2020, 206C are disengaged in parallel, or rather, at the same time.

In some alternative embodiments, the slots 262C and the pins 260C can be arranged so that the actuated connectors are mated or disengaged in a zipper manner (i.e., sequentially) rather than simultaneously as described above. For instance, the slots can be angled differently than one another, have different lengths, etc.

Figures 16A, 16B, 16C:
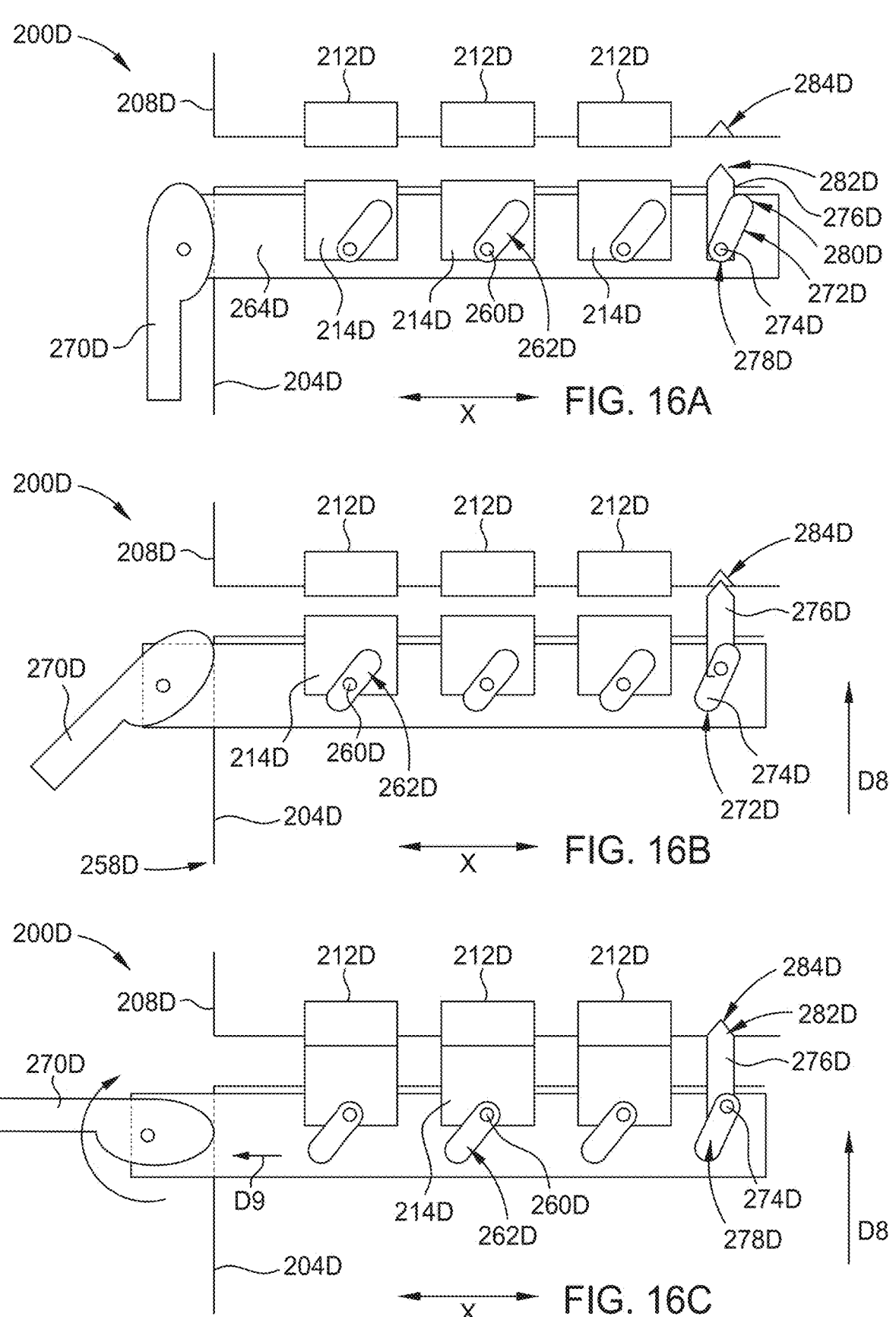
FIGS. 16A, 16B, and 16C illustrate an actuation system coupling connectors in a tray to connectors in a cable cartridge according to an example embodiment of the present disclosure.

With reference now to FIG. 16A, 16B, 16C, an actuation system 200D for mating respective pairs of connectors is provided. The actuation system 200D of FIGS. 16A, 16B, 16C is arranged in a similar manner as the actuation system 200C of FIGS. 15A, 15B, except as provided below.

In the embodiment of FIGS. 16A, 16B, and 16C, a bar 264D of the actuation system 200D defines a plurality of slots 262D each configured to slidably receive respective connector pins 260D of the actuated connectors 214D. The bar 264D also defines a guide slot 272D that is arranged to slidably receive a guide pin 274D of an alignment guide 276D. The guide slot 272D is elongated and has a first end 278D and a second end 280D. The guide pin 274D is rigidly attached to the alignment guide 276D. In this example embodiment, the alignment guide 276D is arranged as a post having a pointed tip 282D. However, the alignment guide 276D can have other shapes in other embodiments. The alignment guide 276D is arranged to be received within a guide socket 284D, which is defined by a side cable cartridge 208D in this example embodiment. In some embodiments, the guide socket 284D can be shaped complementary to the pointed tip 282D of the alignment guide 276D.

The slots 262D of the bar 264D are defined at an angle relative to the first direction X, e.g., at forty-five degrees (45°) with respect to the first direction X. The guide slot 272D is also defined at an angle relative to the first direction X, but at a different angle than the slots 262D (e.g., at seventy degrees (70°) with respect to the first direction X). In at least some embodiments, the guide slot 272D is defined at an angle that is at least twice as great as the angles of the slots 262D, relative to the first direction X. For instance, in embodiments in which the guide slot 272D is arranged at sixty degrees (60°) with respect to the first direction X, the slots 262D are arranged at or less than thirty degrees (30°) with respect to the first direction X. In at least some embodiments, the guide slot 272D is defined at an angle so that the alignment guide 276D extends at a faster rate than the actuated connectors 214D, which allows the alignment guide 276D to be received within the guide socket 284D first or before the actuated connectors 214D mate with their respective fixed connectors 212D. This provides an initial stage of alignment before the actuated connectors 214D are mated with their respective fixed connectors 212D.

To move the actuated connectors 214D from the retracted position to the extended position (e.g., along a direction D8 from their positions in FIG. 16A to their positions in FIG. 16C), a lever 270D coupled with the bar 264D can be moved (e.g., rotated manually or by an automated mechanism, such as an electric motor) to pull the bar 264D towards a front side 258D of the tray 204D (or alternatively the rear side of the tray 204D). In this way, the bar 264D can be moved in a direction D9 along the first direction X. When the bar 264D is moved along the direction D9, connector pins 260D of the actuated connectors 214D are slid within their respective slots 262D while the guide pin 274D is slid within the guide slot 272D. The guide pin 274D slides within the guide slot 272D at a faster rate than does the connectors pins 260D within their respective slots 262D. As shown in FIG. 16B, which shows an intermediate position during an actuation process, the guide pin 274D is further toward the second end 280D of the guide slot 272D than the connector pins 260D are toward the second ends of their respective slots 262D. Moreover, as illustrated in FIG. 16B, the alignment guide 276D is received, at least in part, within the guide socket 284D before the actuated connectors 214D reach or mate with their respective fixed connectors 212D. Accordingly, the alignment guide 276D facilitates alignment of the actuator connectors 214D with their corresponding fixed connections 212D before mating (e.g., along the first direction X). In FIG. 16C, a greater portion of the alignment guide 276D is received within the guide socket 284D (than in FIG. 16B), and the actuated connectors 214D are in mating engagement with their fixed connectors 212D.

While only one alignment guide and one guide socket are depicted in FIGS. 16A, 16B, and 16C, in some embodiments, the actuation system 200D can include multiple alignment guides and corresponding guide sockets, e.g., arranged along the first direction X.

In some further embodiments, any of the actuation systems described above can be modified so that both sets of connectors can be moved or actuated. That is, the set of connectors of the tray and the set of connectors of the cable cartridge can both be movable or actuated connectors. Any combination of the actuated connectors can be used. For instance, in one example embodiment, a first set of connectors can be actuated in parallel, e.g., using the technique described in FIGS. 14A, 14B or FIGS. 15A, 15B or FIGS. 16A, 16B, 16C, so as to travel a distance toward the second set of connectors, but not all the way or at least so the first and second connectors do not mate. Then, the second set of connectors can be actuated, e.g., using the technique described in FIGS. 13A, 13B, so as to travel a distance toward the first set of connectors and so that the first set of connectors mate with the second set of connectors.

In some further embodiments, the connectors of a cable cartridge and/or the side connectors of a tray can be arranged as dual-ganged connectors connected together by a link and actuated in unison. FIGS. 17A through 17E illustrate one example actuation system 200E having dual-ganged connectors.

Figure 17A:
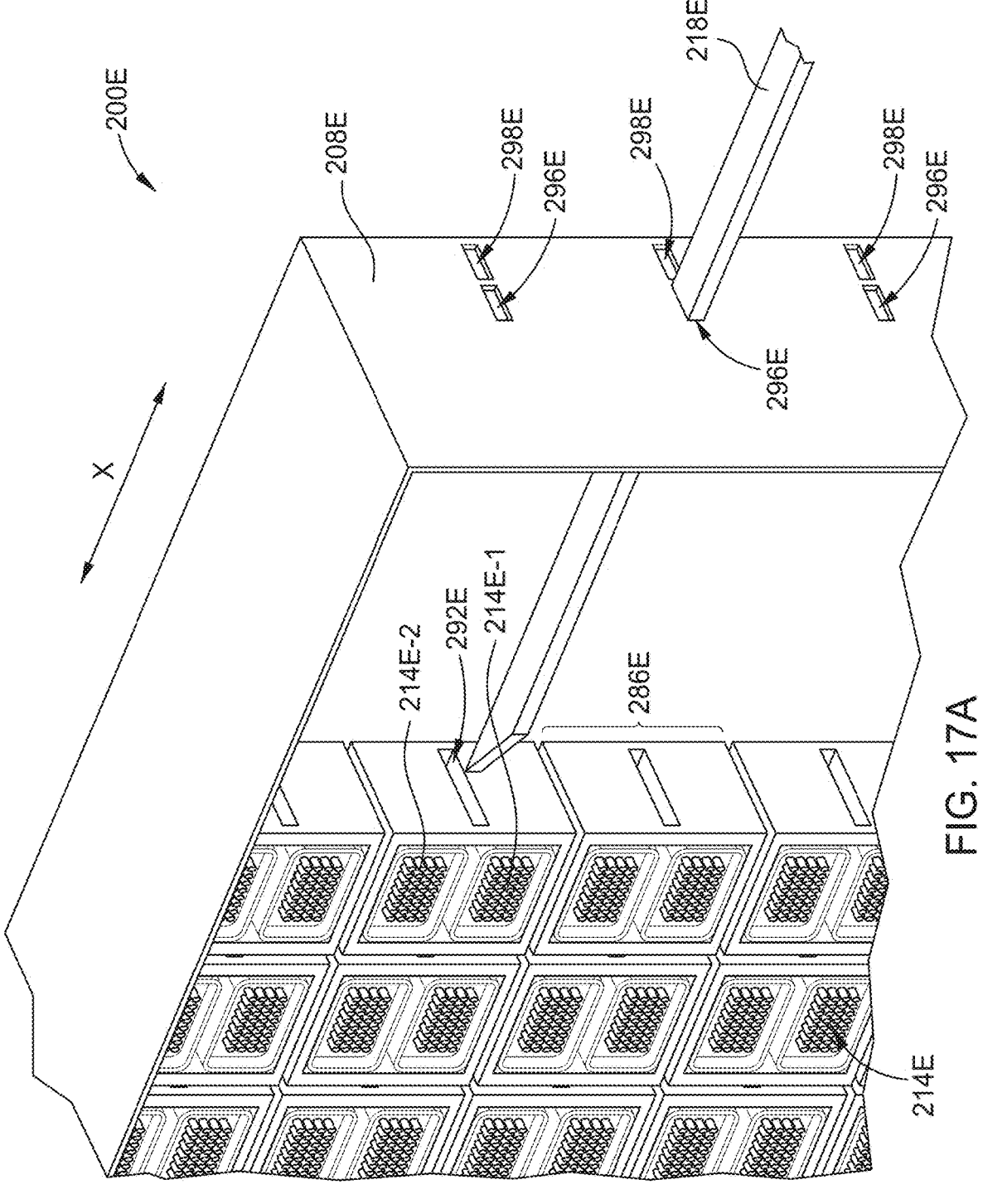
FIGS. 17A, 17B, 17C, 17D, 17E, and 17F illustrate an actuation system for coupling connectors in a tray to connectors in a cable cartridge according to an example embodiment of the present disclosure.
Figures 17B, 17C:
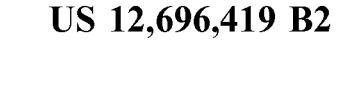
Figures 17D, 17E, 17F:
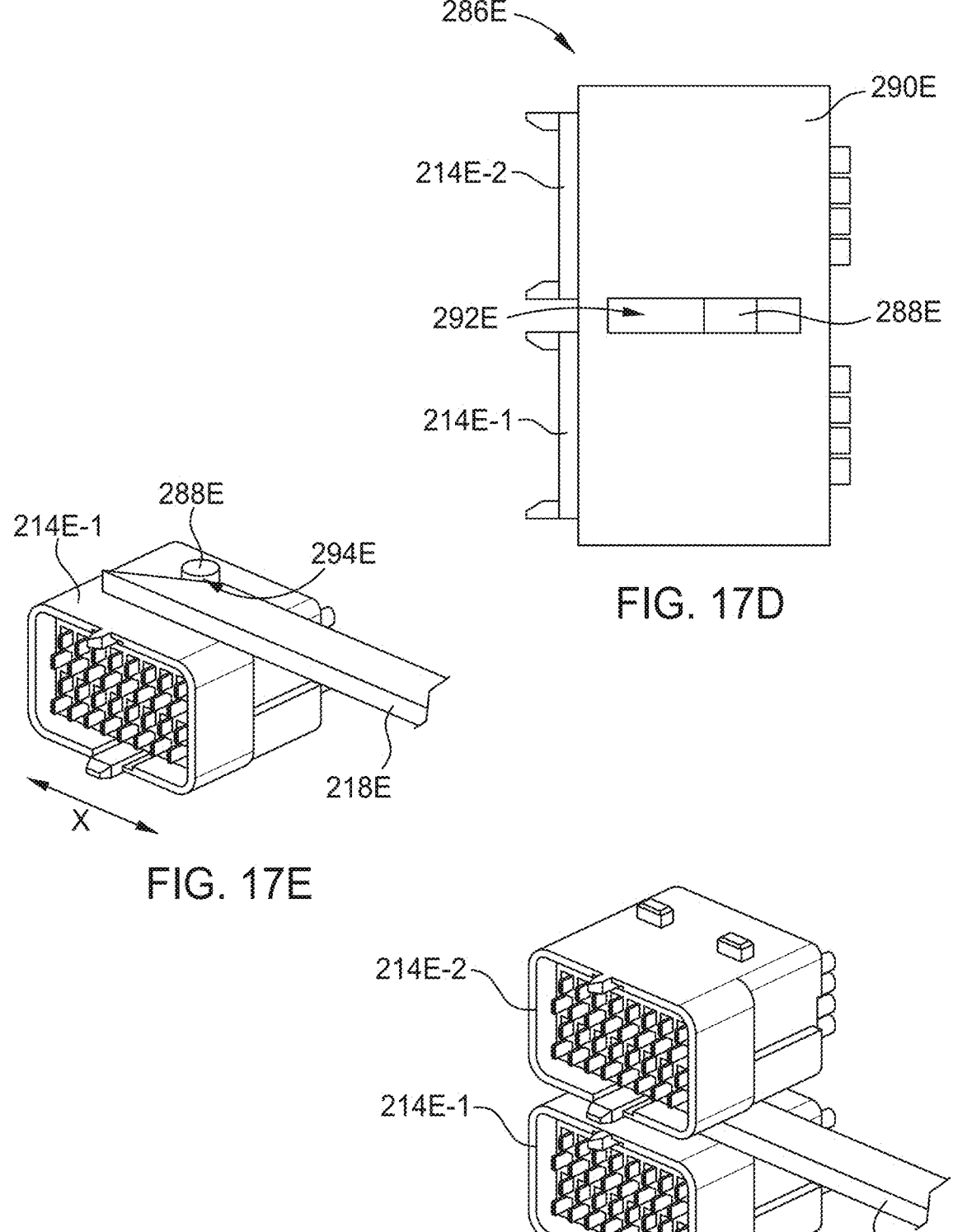

FIG. 17A illustrates a perspective view of a portion of a cable cartridge 208E having a plurality of connectors, which are actuated connectors 214E in this example embodiment. The actuated connectors 214E are arranged in rows and columns within the cable cartridge 208E. Particularly, the actuated connectors 214E are arranged as a plurality of dual-ganged connectors, or ganged connector modules 286E. Each ganged connector module 286E has a first actuated connector 214E-1 and a second actuated connector 214E-2 ganged together by a link 288E (FIGS. 17D, 17E). Thus, the first and second actuated connectors 214E-1, 214E-2 are movable in unison between a retracted position, e.g., as shown in FIG. 17B, and an extended position, e.g., as shown in FIG. 17C. The first and second actuated connectors 214E-1, 214E-2 are movable along a direction perpendicular to a first direction X.

The first and second actuated connectors 214E-1, 214E-2 of a given ganged connector module 286E are disposed within a connector housing 290E (e.g., stacked on top of each other). Each connector housing 290E defines a slot 292E that provides access for a tool 218E (e.g., an actuation spear having a sloped tip) to engage the link 288E, such as a surface 294E of the link 288E as shown in FIG. 17E. In this embodiment, the link 288E has a cylindrical shape and the surface 294E is a curved outer surface of the cylinder. The link 288E can extend between and connect the actuated connectors of a given connector module 286E. The curved surface of the link 288E can facilitate the sloped surface of the tool sliding there along when the tool 218E engages the link 288E, which can reduce the force needed to actuate or move the actuated connectors of the ganged connector modules 286E. In other embodiments, the link 288E can have other configurations.

When moving the actuated connectors 214E to the extended position to mate with corresponding connectors, the tool 218E can engage surface 294E of the link 288E, e.g., as shown in FIG. 17E, to move the actuated connectors 214E of a given pair (or actuated connectors of a given row) in a direction D9 towards the connectors of the tray (not shown). When moving the actuated connectors 214E to the retracted position to disengage from their corresponding connectors, the tool 218E can be flipped and can engage the surface 294E of the link 288E to move the actuated connectors 214E of a given pair (or actuated connectors of a given row) in a direction away from the connectors of the tray (not shown), or rather, a direction opposite the direction D9. In one embodiment, there is approximately 17 pounds of force used to retract and extend the connectors. In one embodiment, less than 5 pounds of force is used to push the spear and cause the actuation.

The cable cartridge 208E, or a housing thereof, can define an extension opening 296E and a retraction opening 298E, e.g., one for each row of ganged actuated connectors as shown in FIG. 17A. The extension opening 296E and the retraction opening 298E are aligned with the slot 292E (or slots of the modules 286E of a given row) and arranged to receive the tool 218E. For instance, to move the actuated connectors 214E to the extended position so that they mate with their corresponding connectors, the tool 218E can be inserted through the extension opening 296E, e.g., as depicted in FIG. 17A, and moved through the row to sequentially engage one link after another. To move the actuated connectors 214E to the retracted position, the tool 218E can be flipped so that the sloped surface thereof faces an opposite direction, and the tool 218E can be inserted through the retraction opening 298E and moved through the row to sequentially engage one link after another.

In other embodiments, the actuated connectors of the ganged connector modules 286E can be actuated using any of the actuation techniques disclosed herein. Further, while the ganged connector modules are depicted as being arranged in the cable cartridge 208E of FIG. 17A, one or more trays of a rack can have ganged connector modules in addition or alternatively to the cable cartridge 208E.

FIG. 18 is a flow diagram for an example method 300 of actuating one set of connectors to mate with another set of connectors.

At 302, the method 300 can include aligning a first set of electrical connectors disposed on a first side of a tray along a first direction to a second set of electrical connectors so that the first and second sets of electrical connectors align along the first direction, wherein the tray is configured to mount in a rack. In some implementations, the second set of electrical connectors are disposed within a side cable cartridge configured to mount in the rack. In such implementations, the first and second sets of electrical connectors can be aligned with one another along the first direction by sliding the tray and the side cable cartridge into the rack.

At 304, the method 300 can include actuating one of the first and second sets of electrical connectors while the other set includes fixed connectors. The actuated set of connectors include connection elements to be used to extend the actuated connectors to mate with the fixed connectors. In some implementations, the one of the first and second sets of electrical connectors are actuated so that the electrical connectors mate with the fixed connectors in series, or rather, sequentially at different times. In some implementations, the one of the first and second sets of electrical connectors are actuated so that the electrical connectors mate with the fixed connectors in parallel, or rather, at the same time.

In some implementations, the connection elements can be respective slots arranged to receive a tool (e.g., an actuation spear), e.g., as shown in FIGS. 13A and 13B. In some implementations, the connection elements can be a plurality of arms and a movable bar, e.g., as shown in FIGS. 14A and 14B. In some implementations, the connection elements can be a plurality of connector pins that are slidably received within respective slots in a bar, e.g., as shown in FIGS. 15A and 15B. In some implementations, the connection elements can be a plurality of connector pins that are slidably received within respective slots in a bar and an alignment guide can be used to initiate, maintain, or otherwise facilitate alignment of the connectors during the mating process, e.g., as shown in FIGS. 16A, 16B, and 16C. In some implementations, the actuated connectors can be ganged together in pairs by respective links, and the connection elements can be respective slots and links, e.g., as shown in FIGS. 17A through 17F.

Alignment System

In some embodiments, a tray and a side cable cartridge of a rack can include alignment features that provide tolerance and force resolution when aligning the tray to the side cable cartridge, or vice versa, and aligning connectors of the tray with connectors of the side cable cartridge. An example embodiment is provided below with reference to FIGS. 19A, 19B, 19C.

Figure 19A:
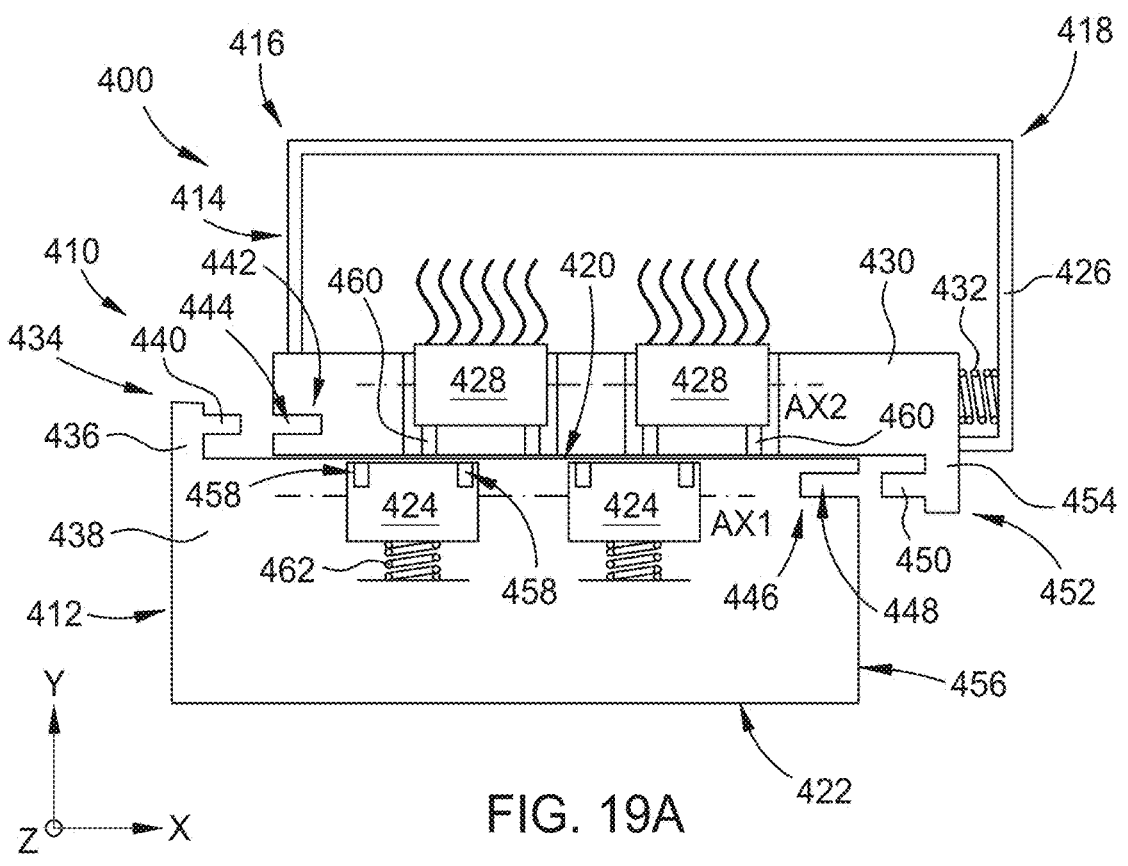
FIGS. 19A, 19B, 19C, and 19D illustrate an alignment system for aligning a tray with a cable cartridge and connectors of the tray with connectors of the cable cartridge, according to an example embodiment of the present disclosure.
Figure 19B:
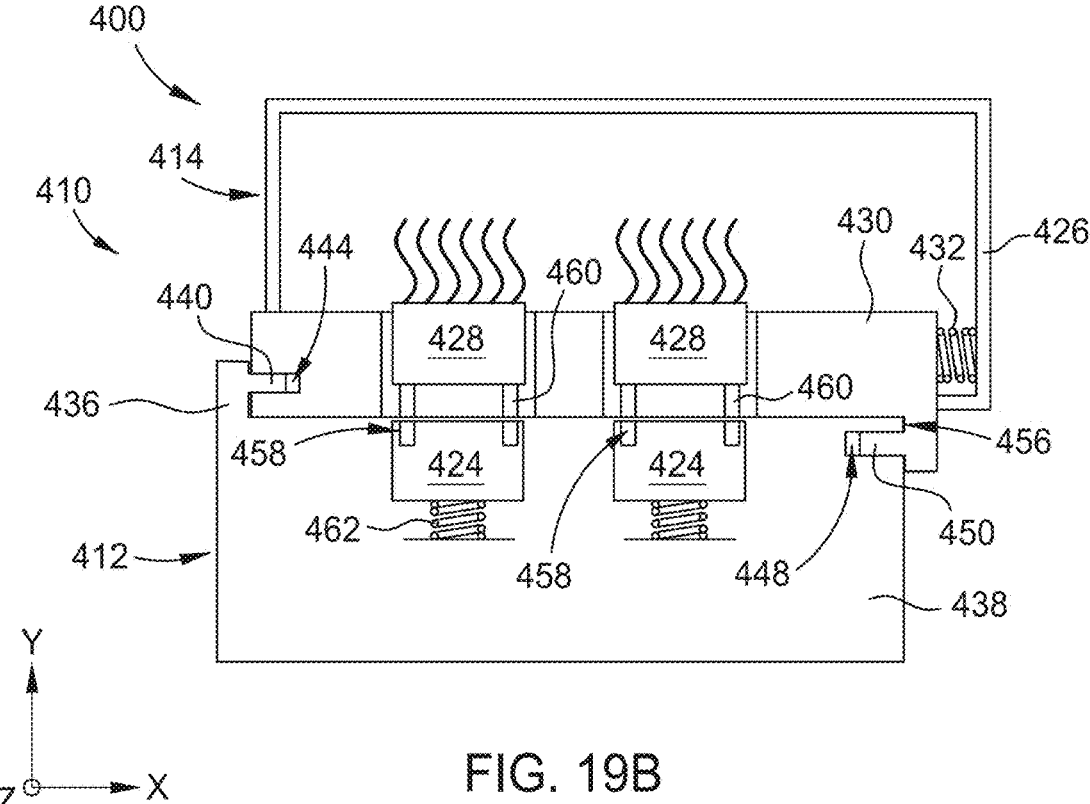
Figure 19C:
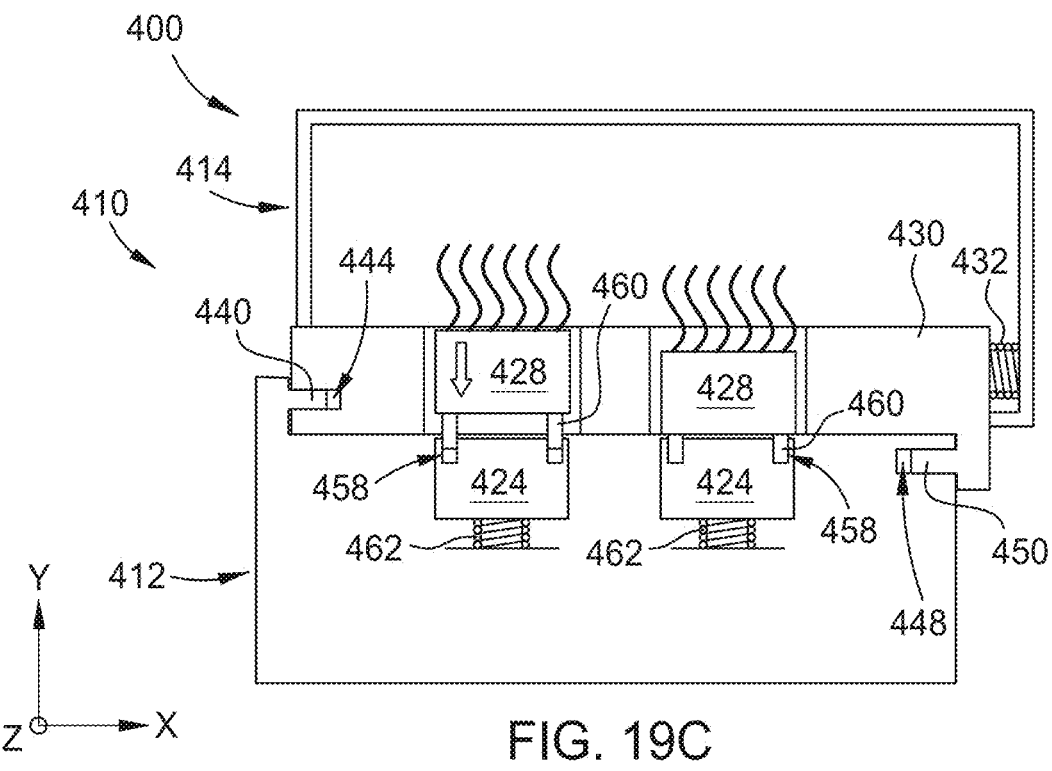

FIGS. 19A, 19B, and 19C schematically illustrate a rack 400 having an alignment system 410 according to embodiments of the present disclosure. The alignment system 410 includes or is formed by features of a tray 412 and a cable cartridge 414 of the rack 400. The rack 400 has a front side 416 and a rear side 418. For reference, the rack 400 defines a first direction X, a second direction Y, and a third direction Z, which are mutually perpendicular to one another and form an orthogonal direction system.

As shown in FIG. 19A, the tray 412 is configured to mount into the rack 400. For instance, the tray 412 can be slid into the rack 400 relative to the cable cartridge 414 along the first direction X. The tray 412 can be one of a plurality of trays that can be mounted into the rack 400. The tray 412 has a front side, a rear side, a first side 420, and a second side 422, which is opposite the first side 420. The tray 412 includes at least one first electrical connector 424 arranged at the first side 420 along the first direction X. In some embodiments, the tray 412 can include a plurality of first electrical connectors 424 disposed along a first axis AX1, e.g., as shown in FIG. 19A. The first axis AX1 is parallel with the first direction X. The first electrical connectors 424 can be arranged in a sidewall of the tray 412.

The cable cartridge 414, or component, is configured to mount into the rack 400 as well. The cable cartridge 414 includes a housing 426 and at least one second electrical connector 428 disposed within the housing 426. In some embodiments, the cable cartridge 414 can include a plurality of second electrical connectors 428 disposed along a second axis AX2 parallel to the first axis AX1, e.g., as shown in FIG. 19A. Accordingly, the second axis AX2 is parallel with the first direction X, and in this example, the first and second electrical connectors 424, 428 are disposed along respective axes AX1, AX2 that are parallel to the direction that the tray 412 is slid into the rack 400, e.g., the first direction X in this example. The second electrical connectors 428 can be held by a bar 430. The cable cartridge 414 can also include a bias spring 432 that is attached to the bar 430. The bias spring 432 can be disposed between the bar 430 and the housing 426, for example. The bias spring 432 biases the bar 430 and the second electrical connectors 428 along the first direction X.

The tray 412 and the cable cartridge 414 can include coarse alignment features that function to align the tray 412 to the cable cartridge 414, e.g. when the tray 412 is slid into the rack 400 relative to the cable cartridge 414.

In at least some embodiments, at the front side 416, the tray 412 includes a first alignment element 434. As depicted, the tray 412 includes a forward projection 436 extending from a main body 438 of the tray 412. The forward projection 436 extends from the main body 438 along the second direction Y. The forward projection 436 extends a distance from the main body 438 so that the tray 412 overlaps with the cable cartridge 414 along the second direction Y when the tray 412 is slid into the rack 400 relative to the cable cartridge 414 along the first direction X. The first alignment element 434, or forward alignment pin 440 in this example, extends from the forward projection 436 along the first direction X toward the rear side 418 of the rack 400. The forward alignment pin 440 is arranged to be received by a second alignment element 442, or in this embodiment, a forward alignment aperture 444 defined by the bar 430 of the cable cartridge 414. In this regard, the first alignment element 434 is configured to mate with the second alignment element 442 when the tray 412 is slid into the rack 400.

In at least some embodiments, at the rear side 418, the tray 412 includes a third alignment element 446, which is a rear alignment aperture 448 in this example embodiment. The rear alignment aperture 448 is arranged to receive a rear alignment pin 450, or fourth alignment element 452, of the bar 430 of the cable cartridge 414. The rear alignment pin 450 extends from a rear projection 454 of the bar 430. The rear projection 454 extends from a main body of the bar 430 along the second direction Y. The rear projection 454 extends a distance from the main body of the bar 430 so that the cable cartridge 414 overlaps with the tray 412 along the second direction Y when the tray 412 is slid into the rack 400 relative to the cable cartridge 414 along the first direction X. The fourth alignment element 452, or the rear alignment pin 450 in this example, extends from the rear projection 454 along the first direction X toward the front side 416 of the rack 400. The rear alignment pin 450 is arranged to be received by the third alignment element 446, or in this embodiment, the rear alignment aperture 448 defined by the tray 412. In this regard, the third alignment element 446 is configured to mate with the fourth alignment element 452 when the tray 412 is slid into the rack 400.

Accordingly, when the tray 412 is slid into the rack 400 relative to the cable cartridge 414, the insertion of the forward and rear alignment pins 440, 450 in their respective forward and rear alignment apertures 444, 448 can facilitate coarse alignment of the tray 412 to the cable cartridge 414. Mating of the first and second alignment elements 434, 442 and mating of the third and fourth alignment elements 446, 452 aligns the first and second electrical connectors 424, 428. Moreover, the bias spring 432 can also help with alignment by providing tolerance so that the rear alignment pin 450 is fully seated in the rear alignment aperture 448 of the tray 412. That is, a technician can push on the tray 412 to slide it into the rack 400, which compresses the bias spring 432. This ensures that a desired surface of the tray 412 (e.g. a rear surface 456 of the tray 412) contacts a surface of the rear projection 454 from which the rear alignment pin 450 extends (e.g., bottoms out). For example, the bias spring 432 can set a common depth datum at the nose or forward side of the tray 412.

The tray 412 and the cable cartridge 414 can include fine alignment features that function to align the first electrical connectors 424 of the tray 412 to the second electrical connectors 428 of the cable cartridge 414.

In at least some embodiments, the first electrical connectors 424 each define pin apertures 458 and the second electrical connectors 428 each include connector alignment pins 460 that can be received within respective ones of the pin apertures 458. That is, when the connector alignment pins 460 are aligned with the pin apertures 458, e.g., along the first and third directions X, Z, and the second electrical connectors 428 are actuated to move along the second direction Y, the connector alignment pins 460 can be received by respective ones of the pin apertures 458, e.g., as shown in FIG. 19C. Further, the first electrical connectors 424 can be connected to respective ones of a plurality of connector bias springs 462. The connector bias springs 462 bias their respective first electrical connectors 424 along the second direction Y, which is perpendicular to the first direction X. The connector bias springs 462 can facilitate the mating of the first and second electrical connectors 424, 428 and can dampen forces associated with the actuation action.

With reference to FIGS. 19A, 19B, and 19C, an example manner in which the alignment system 410 can be used to align the tray 412 to the cable cartridge 414 and for aligning the first and second electrical connectors 424, 428 will now be described. FIGS. 19A, 19B, and 19C show a progression of the tray 412 being slid from left to right along the first direction X.

In FIG. 19A, a beginning insertion stage is depicted in which the tray 412 is being slid into the rack 400 left to right relative to the cable cartridge 414 along the first direction X. The cable cartridge 414 is already mounted in the rack 400. As shown in FIG. 19A, as the tray 412 is slid into the rack 400, the forward alignment pin 440 is aligned with the forward alignment aperture 444, e.g., along the second direction Y, and the rear alignment aperture 448 is aligned with the rear alignment pin 450, e.g., along the second direction Y. In this way, the forward and rear alignment pins 440, 450 will be able to mat with or be received by their respective forward and rear alignment apertures 444, 448, e.g., as shown in FIG. 19B.

In FIG. 19B, a first stage alignment is depicted in which the coarse alignment features of the tray 412 and the cable cartridge 414 engage or mate. Particularly, in FIG. 19B, the forward and rear alignment pins 440, 450 have mated with their respective forward and rear alignment apertures 444, 448. The bias spring 432 can also help with alignment by providing tolerance so that the rear alignment pin 450 is fully seated in the rear alignment aperture 448 of the tray 412. That is, a technician can push on the tray 412 to slide it in the rack 400, which compresses the bias spring 432. This ensures that a desired surface of the tray 412 (e.g. the rear surface 456 of the tray 412) contacts a surface of the rear projection 454 from which the rear alignment pin 450 extends. In this regard, the tray 412 can "bottom out" on the bar 430. The bias spring 432 can set a common depth datum at the nose or forward side of the tray 412.

Further, in some embodiments, the bias spring 432 allows the bar 430 to "float" at least in the first direction X to provide leeway so that the second electrical connectors 428 can be aligned with the first electrical connectors 424 in the tray 412. In some embodiments, the bar 430 can float in the first, second, and third directions X, Y, and Z. Accordingly, if the bar 430 is misaligned with the tray at the beginning insertion stage (FIG. 19A), the bar 430 can move in the first, second, and/or third directions X, Y, Z when the forward and rear alignment pins 440, 450 are mated with their respective forward and rear alignment apertures 444, 448. Thus, at the first stage alignment depicted in FIG. 19B, the bar 430 is now aligned with the tray 412. That is, the forward and rear alignment pins 440, 450 can provide a course (or initial) alignment in the second and third directions Y, Z. The forward and rear alignment pins 440, 450 can also resolve connector forces locally (e.g., so that the cable cartridge 414 is not loaded).

In FIG. 19C, a second stage alignment (or final stage alignment) is depicted in which the fine alignment features of the tray 412 and the cable cartridge 414 engage or mate. In some embodiments, the second electrical connectors 428 can "float" or shuttle within the bar 430, e.g., in the first and second directions X, Y to provide secondary or fine alignment. Further, in some embodiments, the first electrical connectors 424 can "float" in the second direction Y. Particularly, in this example, the first electrical connectors 424 are biased towards the second electrical connectors 428 in the cable cartridge 414 by the connector bias springs 462. Accordingly, when the second electrical connectors 428 in the cable cartridge 414 are actuated, e.g., using any of the actuation techniques disclosed herein, the connector alignment pins 460 of the second electrical connectors 428 mate with corresponding pin apertures 458 of the first electrical connectors 424. The mating of the connector alignment pins 460 with the pin apertures 458 provides a secondary or fine alignment of the first and second electrical connectors 424, 428, which facilitates good connector contact and mating consistency. Moreover, mating the first and second electrical connectors 424, 428 compresses the connector bias springs 462, e.g., as shown in FIG. 19C. In this manner, the connector bias springs 462 can resolve actuation forces.

Figure 19D:
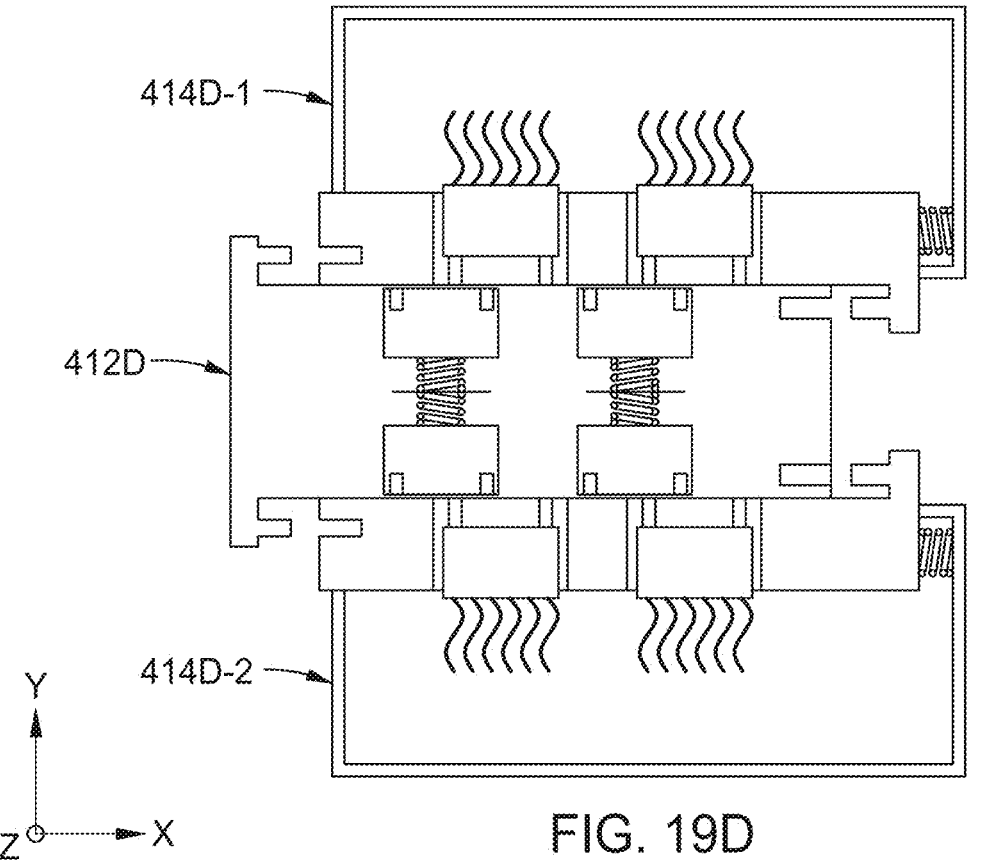

While FIGS. 19A, 19B, 19C illustrate an embodiment in which the tray 412 is slid relative to the cable cartridge 414, the roles can be reversed in other embodiments in which the cable cartridge 414 is slid to mate with the tray 412 (or trays). Further, while the embodiment of FIGS. 19A, 19B, 19C depicts two (2) coarse alignment pins and each connector having two fine alignment pins, any number of coarse pins and/or fine pins can be used. Further, while the embodiment of FIGS. 19A, 19B, 19C depicts the tray 412 being aligned with the cable cartridge 414, in some embodiments, the tray 412 can be slid between two cable cartridges both having alignment features. For instance, FIG. 19D depicts a tray 412D being slid between first and second cable cartridges 414D-1, 414D-2, wherein the tray 412 and the first and second cable cartridges 414D-1, 414D-2 have similar alignment features as described above. Such an embodiment can facilitate alignment of the connectors on both sides of the tray 412 with their corresponding connectors of the first and second cable cartridges 414D-1, 414D-2.

FIG. 20 is a flow diagram for an example method 500 of aligning a tray with a cable cartridge and connectors of the tray with connectors of the cable cartridge, according to an example embodiment of the present disclosure.

At 502, the method 500 can include sliding a tray into a rack, the tray including a first electrical connector and a first alignment element. For instance, with the cable cartridge already mounted in the rack, the tray can be slid relative to the tray along a first direction. In sliding the tray, the first alignment element of the tray (e.g., an alignment pin) can be aligned with a second alignment element (e.g., an alignment aperture) of the cable cartridge, e.g., along a direction perpendicular to the sliding direction of the tray. In this way, the first and second alignment elements can eventually mate, e.g., when the tray is fully slid into the rack. In some implementations, in sliding the tray, a third alignment feature of the tray (e.g., an alignment aperture) can be aligned with a fourth alignment element (e.g., an alignment pin) of the cable cartridge, e.g., along the direction perpendicular to the sliding direction of the tray. The first and second alignment elements can be arranged at a front side of the tray and a front side of the cable cartridge, respectively, while the third and fourth alignment elements can be arranged at a rear side of the tray and a rear side of the cable cartridge, respectively. That is, the third and fourth alignment elements can be arranged at respective rear sides of the tray and the cable cartridge and the first and second alignment elements can be arranged at respective front sides of the tray and the cable cartridge.

At 504, the method 500 can include mounting a component (e.g., the cable cartridge) into the rack, the component including a second electrical connector and the second alignment element, wherein the first alignment element is configured to mate with the second alignment element when the tray is slid into the rack, and wherein mating the first and second alignment elements aligns the first and second electrical connectors. In such implementations, the first and second electrical connectors are disposed along axes that are parallel with a direction that the tray is slid into the rack.

Stated another way, when the tray is slid into the rack, the first alignment element mates with the second alignment element (e.g., an alignment pin can be received within an alignment aperture). The mating engagement of these elements can align the first and second electrical connectors, e.g., along the sliding direction. The first and second alignment elements can provide coarse alignment of the first and second electrical connectors. In some implementations, when the tray is slid into the rack, the third alignment element mates with the fourth alignment element (e.g., an alignment pin can be received within an alignment aperture). The mating engagement of these elements can further align the first and second electrical connectors, e.g., along the sliding direction. In some implementations, the cable cartridge is mounted in a vertical orientation within the rack and the tray is slid into the rack in a horizontal orientation.

At 506, the method 500 can include actuating the first electrical connector toward the second electrical connector, or vice versa, so that a first connector alignment feature of the first electrical connector mates with a second connector alignment feature of the second electrical connector. For instance, in some implementations, the first connector alignment feature is a connector alignment pin and the second connector alignment feature is a connector alignment aperture that receives the connector alignment pin. Mating of the first connector alignment feature with the second connector alignment feature can provide fine alignment of the first and second electrical connectors, which can facilitate the electrical coupling of the first and second electrical connector.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

While the foregoing is directed to specific examples, other and further examples may be devised without departing from the basic scope thereof, and the scope thereof is determined by the claims that follow.

What is claimed is:

1. A system, comprising:
a tray configured to mount into a rack, the tray comprising a first electrical connector and a first alignment element; and
a component configured to mount into the rack, the component comprising a second electrical connector and a second alignment element, wherein the first alignment element is configured to mate with the second alignment element when the tray is slid into the rack, wherein mating the first and second alignment elements align the first and second electrical connectors,
wherein the first and second electrical connectors are disposed along respective axes that are parallel with a direction that the tray is slid into the rack,
wherein the tray comprises a first plurality of electrical connectors, which contains the first electrical connector, that is disposed along a first axis and the component comprises a second plurality of electrical connectors, which contains the second electrical connector, that is disposed along a second axis parallel to the first axis, wherein mating the first and second alignment elements align the first plurality of electrical connectors and the second plurality of electrical connectors.

2. The system of claim 1, wherein the component includes a bias spring attached to a bar that holds the second electrical connector, wherein the bias spring is compressed as the tray slides into the rack and the first and second alignment elements are mated.

3. The system of claim 1, wherein the first and second alignment elements are a pin and a surface defining an aperture in which the pin is inserted.

4. The system of claim 1, wherein the first and second plurality of electrical connectors are disposed on the respective axes that are parallel to the direction that the tray is slid into the rack.

5. The system of claim 1, wherein the first electrical connector comprises a first alignment feature that mates with a second alignment feature on the second electrical connector.

6. The system of claim 5, wherein the first electrical connector is connected to a bias spring that is compressed when the first electrical connector mates with the second electrical connector using the first and second alignment elements.

7. A rack, comprising:
a tray slidably mounted within the rack and having a first set of electrical connectors disposed on a side of the tray along a first direction, the tray being slidable along the first direction and having a first alignment element; and
a cable cartridge mounted within the rack and having a second set of electrical connectors arranged along the first direction, the cable cartridge having a second alignment element,
wherein the first alignment element is arranged to mate with the second alignment element so as to align the first and second electrical connectors along the first direction, and
wherein at least one of the first set of electrical connectors and the second set of electrical connectors is movable along a second direction perpendicular to the first direction.

8. The rack of claim 7, wherein the first and second alignment elements are an alignment pin and an alignment aperture in which the alignment pin is inserted.

9. The rack of claim 8, wherein the tray has a main body and a projection extending from the main body along the second direction, wherein the alignment pin extends from the projection along the first direction.

10. The rack of claim 8, wherein the cable cartridge has a bar that holds the second set of electrical connectors, and wherein the alignment aperture is defined by the bar.

11. The rack of claim 7, wherein the tray comprises a third alignment element and the cable cartridge comprises a fourth alignment element arranged to mate with the third alignment element, wherein the third and fourth alignment elements are arranged at respective rear sides of the tray and the cable cartridge and the first and second alignment elements are arranged at respective front sides of the tray and the cable cartridge.

12. The rack of claim 11, wherein the third alignment element is a rear alignment aperture defined by the tray and the fourth alignment element is a rear alignment pin arranged to mate with the rear alignment aperture, wherein the cable cartridge has a bar movable along the first direction and arranged to hold the second set of electrical connectors, and wherein the bar has a main body and a rear projection extending from the main body along the second direction perpendicular to the first direction, the rear alignment pin extends from the rear projection along the first direction.

13. The rack of claim 7, wherein a first electrical connector of the first set of electrical connectors has a first connector alignment feature and a second electrical connector of the second set of electrical connectors has a second connector alignment feature arranged to mate with the first connector alignment feature.

14. The rack of claim 13, wherein the first connector alignment feature is a connector alignment pin and the second connector alignment feature is a connector alignment aperture that receives the connector alignment pin.

* * * * *